(12) United States Patent
Martinez Quiroz et al.

(10) Patent No.: US 12,307,164 B2
(45) Date of Patent: May 20, 2025

(54) LINKING VIEWS/STATES OF 3D MODELS AND PROPAGATING UPDATES IN SAME

(71) Applicant: Dassault Systemes SolidWorks Corporation, Waltham, MA (US)

(72) Inventors: Felipe Martinez Quiroz, Cambridge (GB); Matthew Lorono, Broomfield, CO (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 981 days.

(21) Appl. No.: 17/246,483

(22) Filed: Apr. 30, 2021

(65) Prior Publication Data

US 2022/0350937 A1    Nov. 3, 2022

(51) Int. Cl.
*G06F 30/10* (2020.01)
*G06F 3/04815* (2022.01)
*G06T 19/20* (2011.01)

(52) U.S. Cl.
CPC .............. *G06F 30/10* (2020.01); *G06T 19/20* (2013.01); *G06F 3/04815* (2013.01); *G06T 2200/24* (2013.01); *G06T 2219/004* (2013.01); *G06T 2219/2012* (2013.01)

(58) Field of Classification Search
None
See application file for complete search history.

(56) References Cited

U.S. PATENT DOCUMENTS

| 6,944,513 | B1 | | 9/2005 | Tomomitsu et al. |
| 9,177,110 | B1 | * | 11/2015 | Fram ........................ G06T 11/60 |
| 9,454,623 | B1 | * | 9/2016 | Kaptsan .................. G06F 30/13 |

(Continued)

FOREIGN PATENT DOCUMENTS

| EP | 3 097 543 A1 | 11/2016 |
| JP | 2001-067394 A | 3/2001 |

(Continued)

OTHER PUBLICATIONS

Ellenberg ("Using 3D Geometry in AutoCAD for multi-view drawings", https://www.youtube.com/watch?v=bAIG7-IzH5s, May 1, 2013) (Year: 2013).*

(Continued)

*Primary Examiner* — Jeffrey J Chow
(74) *Attorney, Agent, or Firm* — Hamilton, Brook, Smith & Reynolds, P.C.

(57) ABSTRACT

A computer-aided design (CAD) system and corresponding method manage three-dimensional (3D) model view/state modifications. The method modifies a parent view of a 3D model in the CAD system based on user input provided to the CAD system. The parent view is linked to a child view of the 3D model that was created from the parent view. The method modifies the child view, automatically, in accordance with the parent view modified. Such linked views and automatic modification enable a user to change view/state of a parent view and have the changes automatically propagated to the child view/state. Further, when such propagation occurs, orientations, positions, and readable directions of annotations are also updated, automatically, saving users (e.g., design engineers) minutes, hours and even days of work on design of the 3D model.

18 Claims, 15 Drawing Sheets

(56) References Cited

U.S. PATENT DOCUMENTS

| | | | | |
|---|---|---|---|---|
| 2007/0211149 | A1* | 9/2007 | Burtnyk | G11B 27/034 |
| | | | | 348/208.4 |
| 2014/0118223 | A1* | 5/2014 | Jensen | G06F 3/048 |
| | | | | 345/2.2 |
| 2016/0054889 | A1 | 2/2016 | Hadley et al. | |
| 2021/0034319 | A1* | 2/2021 | Wang | H04N 13/275 |

FOREIGN PATENT DOCUMENTS

| | | |
|---|---|---|
| JP | 2001-084277 A | 3/2001 |
| JP | 2016-053947 A | 4/2016 |
| JP | 7357715 B2 | 10/2023 |
| WO | 2019/017974 A1 | 1/2019 |

OTHER PUBLICATIONS

Arkance (CADstudio DWGsync—synchronized viewing of 2 DWGs, https://www.youtube.com/watch?v=tS3U5WKG-UE, Apr. 18, 2011) (Year: 2011).*

American Society of Mechanical Engineers (ASME), "Model Organization Practices"; Date of Issuance: Feb. 18, 2019.

European Extended Search Report and Annex to European Search Report for EP Application No. 22170668.2, entitled "Linking Views/States Of 3D Models And Propagating Updates In Same," mailed on Oct. 11, 2022.

* cited by examiner

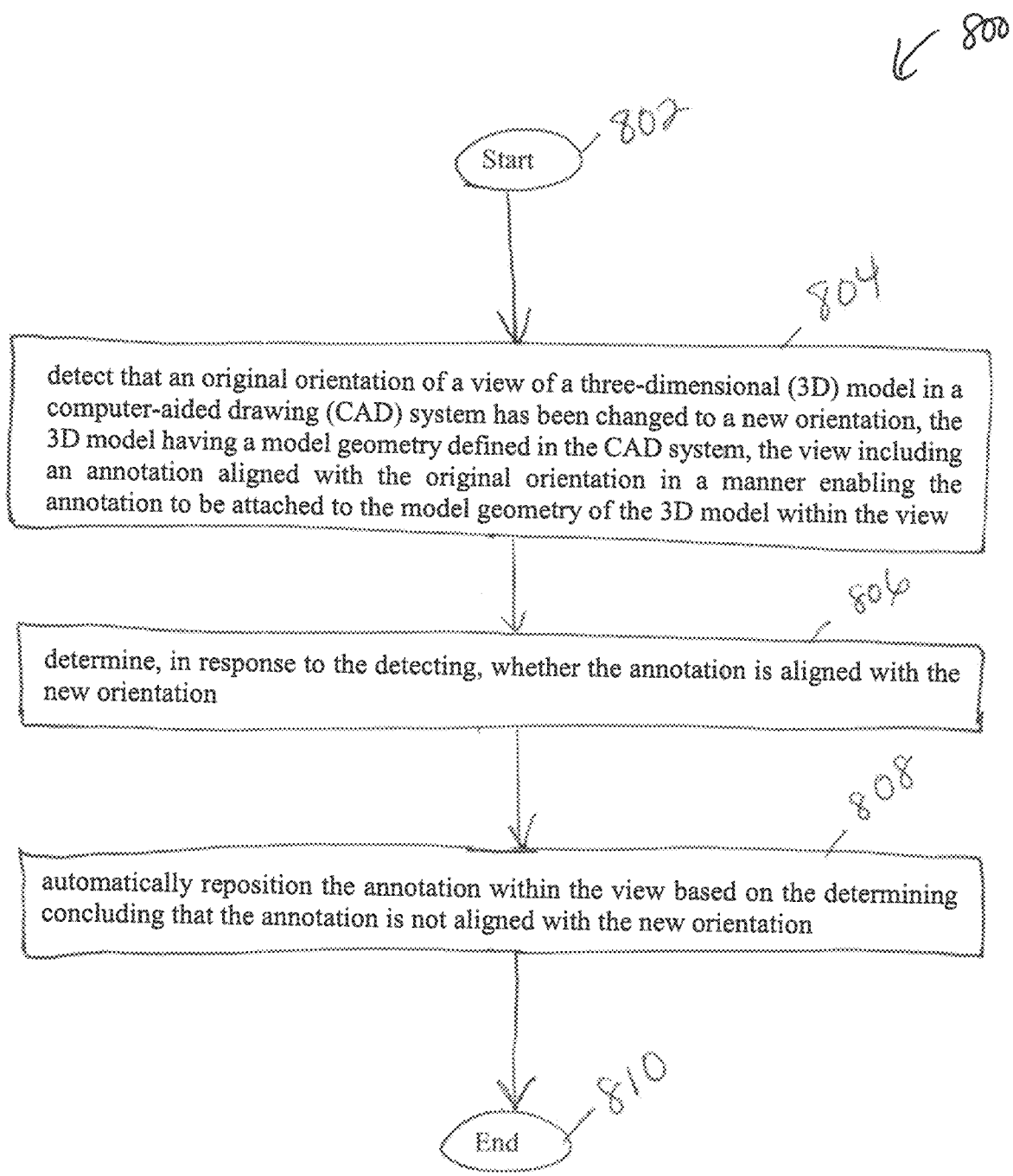

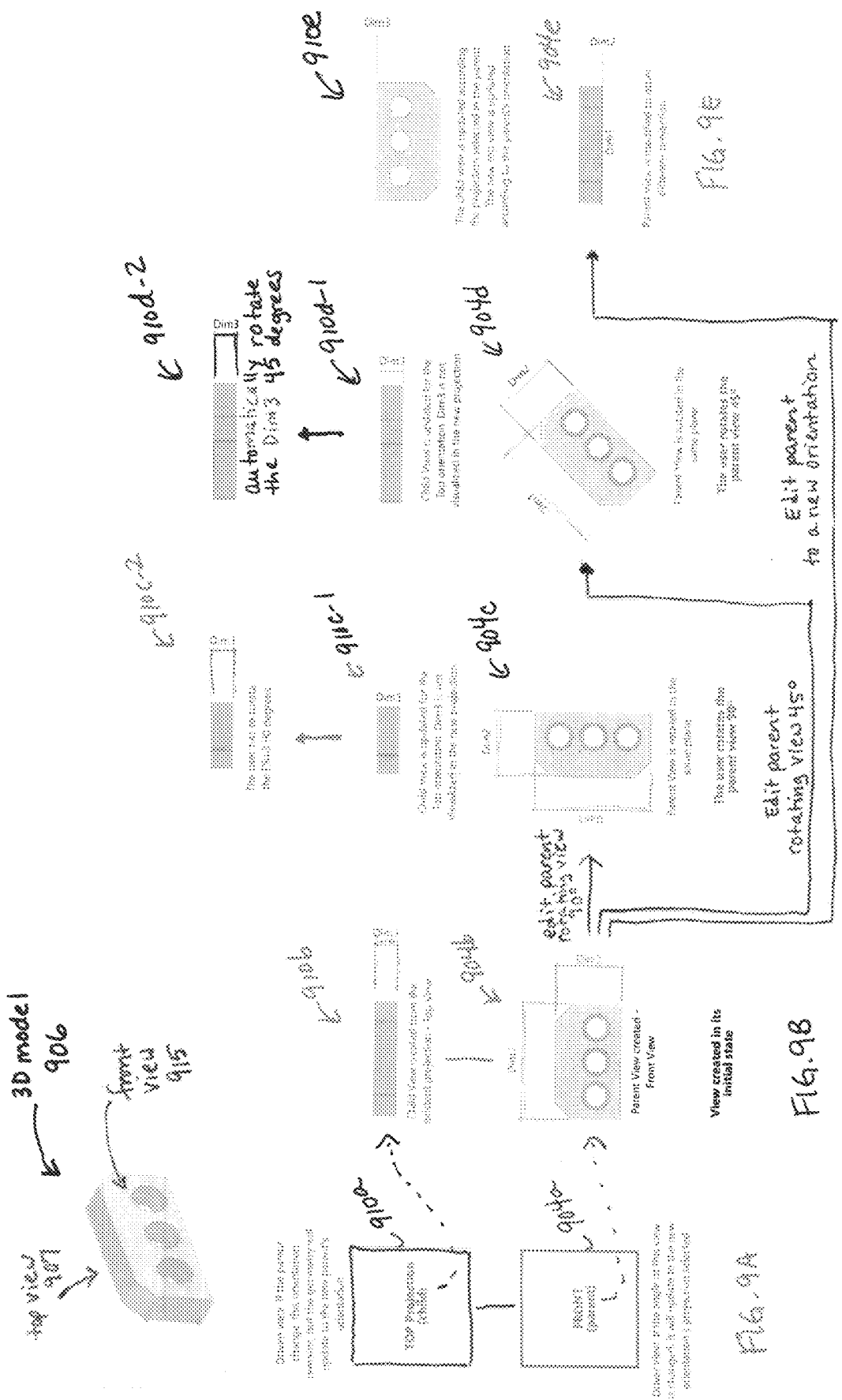

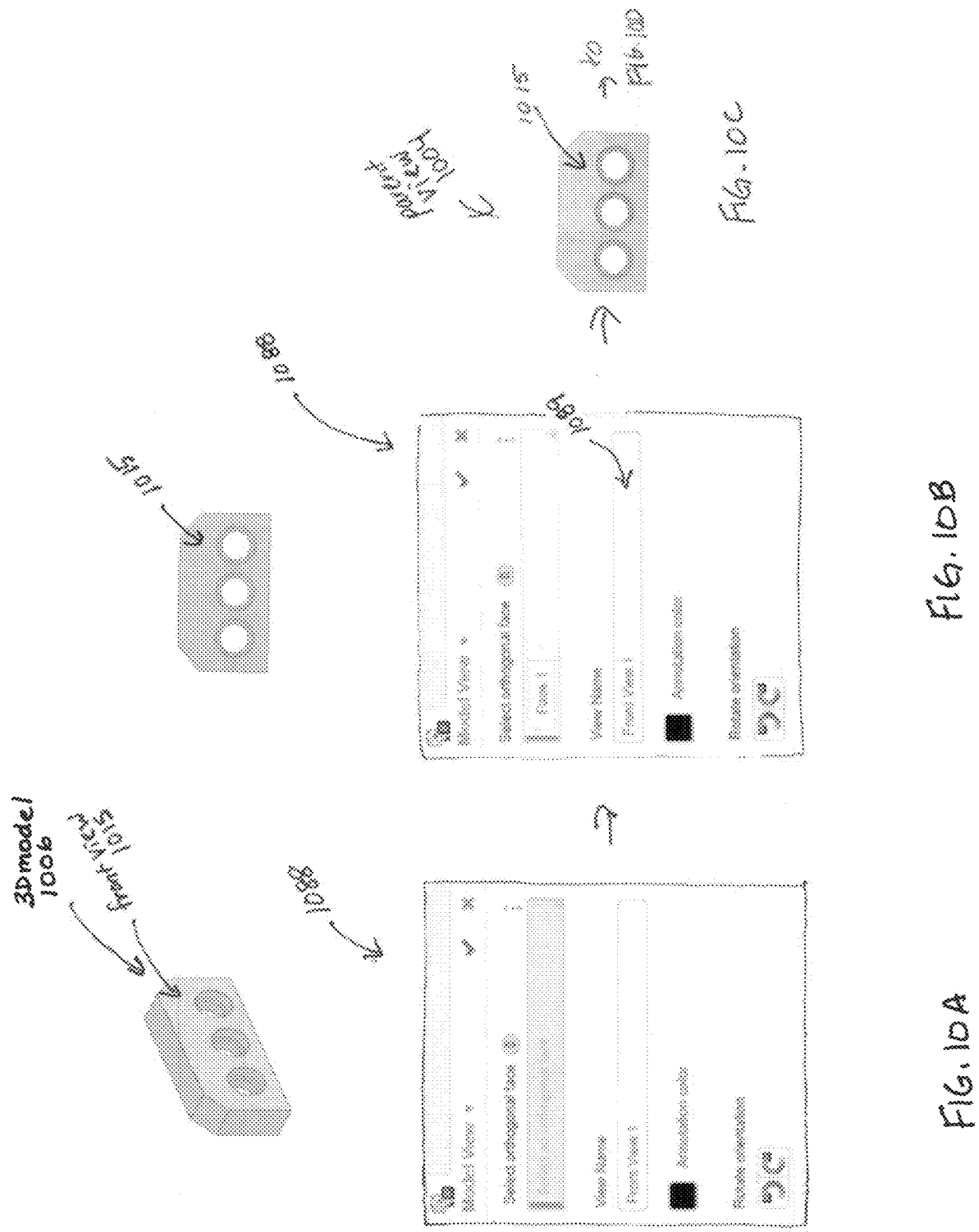

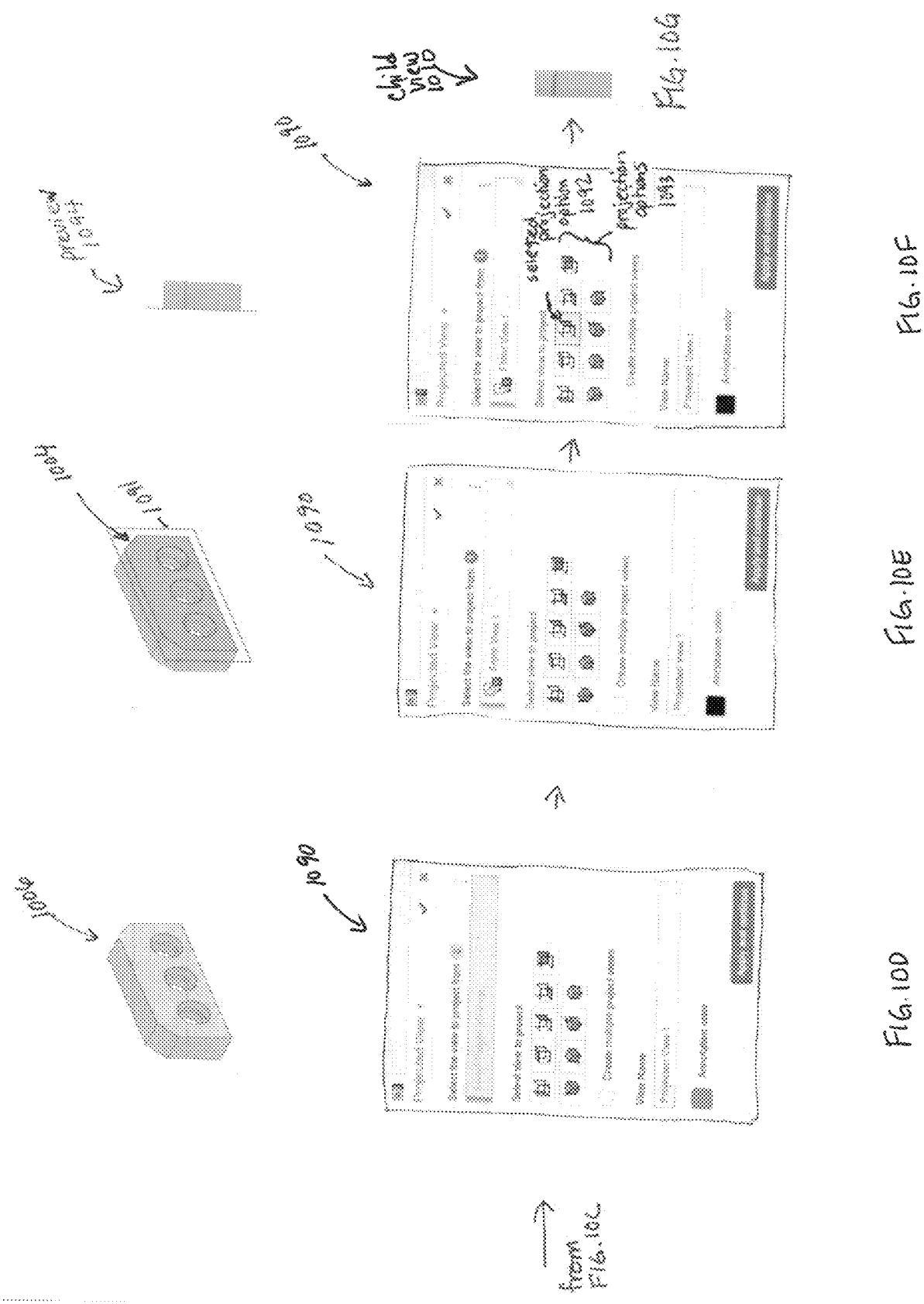

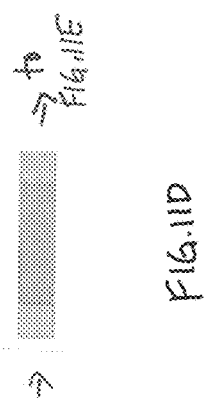
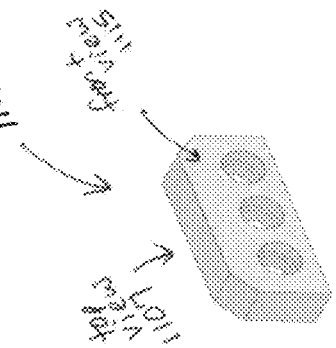
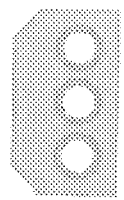
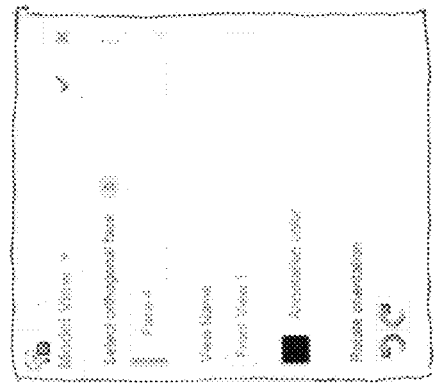
FIG. 11A
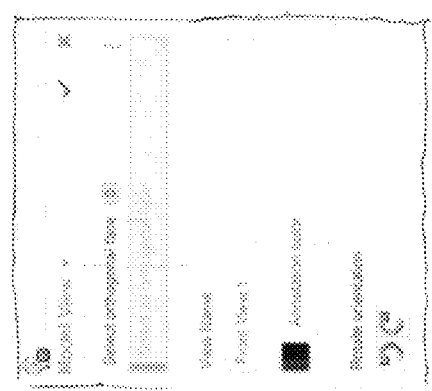
FIG. 11B
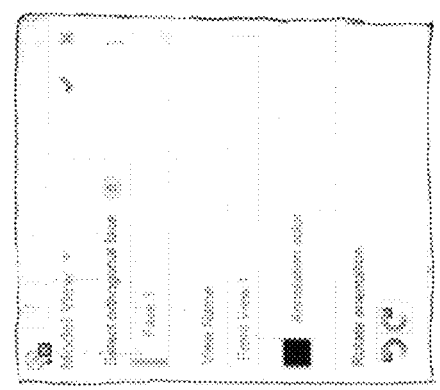
FIG. 11C

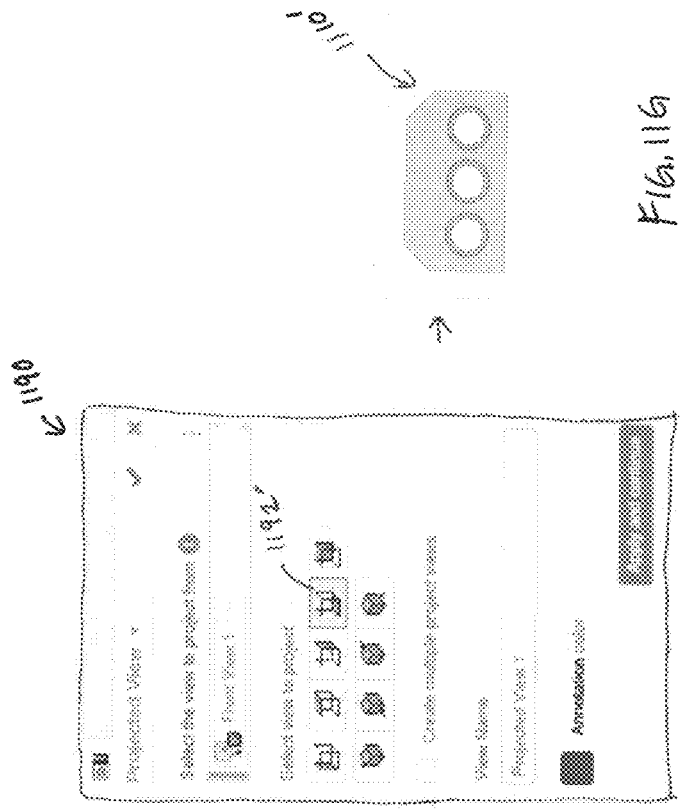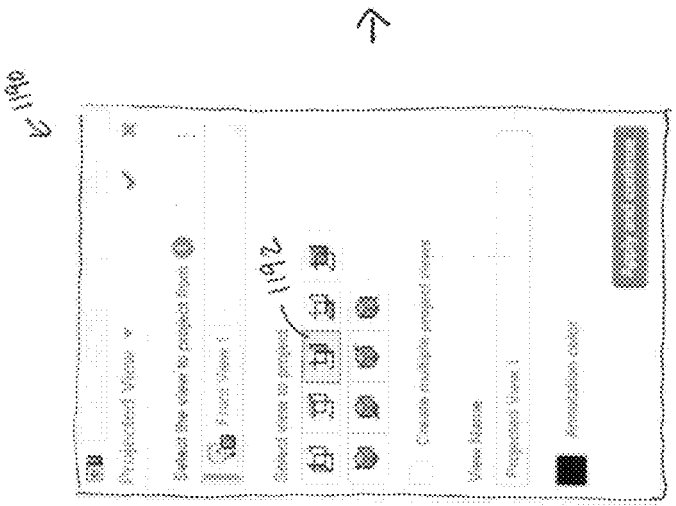

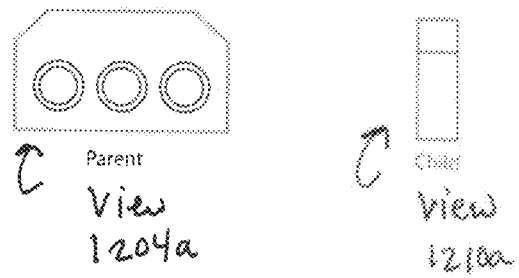
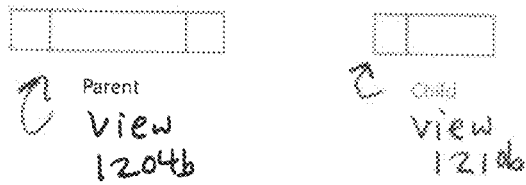
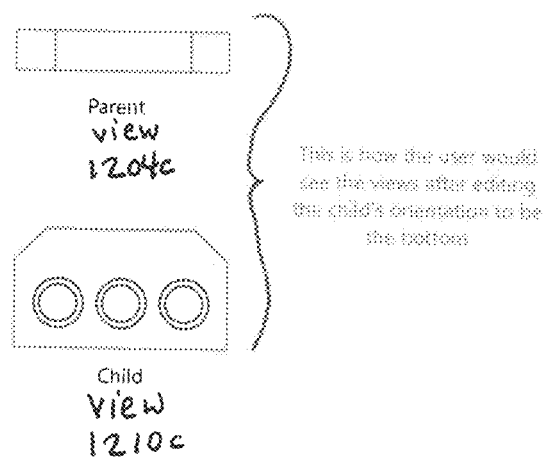
FIG. 12

LINKING VIEWS/STATES OF 3D MODELS AND PROPAGATING UPDATES IN SAME

BACKGROUND

Computer-aided design (CAD) software allows a user to construct and manipulate complex three-dimensional (3D) models. A number of different modeling techniques can be used to create a 3D model. One such technique is a solid modeling technique, which provides for topological 3D models where the 3D model is a collection of interconnected topological entities (e.g., vertices, edges, faces, etc.). The topological entities have corresponding supporting geometrical entities, such as points, trimmed curves, and trimmed surfaces that correspond to the topological faces bounded by the edges. 3D CAD systems may combine solid modeling and other modeling techniques, such as parametric modeling techniques, for use in constructing and manipulating 3D models. Parametric modeling techniques can be used to define various parameters for different features and components of a model, and to define relationships between those features and components based on relationships between the various parameters. A typical user of such a 3D CAD system may be referred to as a design engineer.

The design engineer designs physical and aesthetic aspects of 3D models, and is skilled in 3D modeling techniques. The following are definitions of certain terms that can be used when describing a 3D CAD system that may be used by such a design engineer to design a 3D model.

- 3D model: A 3D model refers to representations of solid geometries in a CAD program. A modeled object may contain none or one or more 3D solids and may contain none or one or more sketches.
- Assembly: A collection of parts and components that form a possibly complex modeled object such as a car or airplane. In a CAD program, an assembly is represented by a document in which parts, features, and other assemblies (subassemblies) are mated together. Parts and subassemblies can exist in documents separate from the assembly.
- Annotated model: a combination of model, annotation, and attributes that describe a product.
- Attribute: Most modern CAD programs have a provision to attach attributes to any geometric entity. The attributes can contain any additional data that may be relevant to the geometric entity.
- Body: A solid body includes topological data and geometric data. The topological data (e.g., faces, edges, vertices, etc.) in a solid body have corresponding geometric data in the same solid body. Each vertex corresponds to a point. Each edge corresponds to a curve. Each face corresponds to a surface.
- Component (with respect to a 3D model): Any part or subassembly within an assembly.
- Edge: A single outside boundary of a feature.
- Entity: A discrete element, such as a face, edge, vertex, etc.
- Face: A selectable area (planar or otherwise) of a model or surface with boundaries that help define the shape of the model or surface. For example, a rectangular solid has six faces and a cylindrical solid has three faces.
- Feature: An individual shape that, combined with other features, makes up a part or assembly. A 3D model is modified by creating CAD features, such as fillets, chamfers, extrudes, cuts, holes, angled drafts, etc. A feature may be referred to interchangeably herein as a CAD feature.
- Feature node: A representation of a feature in a feature tree is called a feature node. Most modern CAD programs associate a unique identifier, such as a number or an alphanumeric text, with each feature node. A feature tree may be referred to interchangeably herein as a specification tree or simply, a tree.
- Feature tree (i.e., specification tree or tree): In conventional CAD programs, the features in a 3D model are organized in the form of a tree, called a feature tree or specification tree, that lists each feature and defines how the feature relates to higher and lower level features in the tree.
- Geometric Entity: A geometric entity may refer to a feature node or some entity within a CAD feature, such as a line, curve, plane, surface, etc. Most modern CAD programs associate a unique identifier with each geometric entity. The unique identifier may be a number or an alphanumeric text.
- Large Design Review: A mode of assembly review that allows a very large assembly to open quickly while still retaining capabilities that are useful when conducting design reviews of assemblies. In large design review mode, a user can, for example, navigate a design tree of the assembly, measure distances, create cross sections, hide and show components, and create, edit, and play back walk-throughs. Large design review mode can also be referred to as "Graphics Mode."
- Part: A single 3D object made up of features. A part can include multiple bodies. A part can become a component in an assembly. Examples of parts include, for example, a bolt, pin, plate, etc.
- Plane: A flat construction geometry.
- Point: A singular location in a 3D model.
- Presentation state: a retrievable collection or set of model display elements arranged for formal display to a viewer.
- Resolved: A state of an assembly component that is fully loaded in memory. When resolved, all of the component's model data is available, so its entities can be selected, referenced, edited, etc.
- Subassembly: An assembly that is part of a larger assembly. For example, a steering mechanism of a car is a subassembly of the car.
- Surface: A zero-thickness planar or 3D entity with edge boundaries.
- Saved view: a stored or retrievable specific orientation and a magnification factor of an annotated model.
- Vertex: A point at which two or more edges intersect. Vertices can be selected for sketching, dimensioning, and other CAD operations.

As disclosed above, a CAD system may be a solid modeling system that is a feature-based 3D CAD system, wherein a 3D model of a part may be constructed using various features, such as bosses, fillets, chamfers, cuts, holes, shells, lofts, sweeps, etc. CAD systems store the contents of parts, subassemblies, and assemblies in a data file(s) that may be referred to as a CAD data file(s). In addition to features, the contents of such CAD data file(s) may include design profiles, layouts, internal components (e.g., bodies), and graphical entities.

SUMMARY

Example embodiments disclosed herein link parent (e.g., initial, primary, principle) and child (e.g., subsequent, secondary) views/states within a three-dimensional (3D) computer-aided design (CAD) modelling environment which enables modifications to a parent view/state of a 3D model to cause an automatic update, via a computer processor, to be made to the child view/state linked thereto. If such views/states are updated to have a different display of the 3D model, other views/states within that 3D model that are linked to same are updated in kind. Further, an example embodiment automatically repositions and reorients annotations aligned and applied to those views/states. In this way, CAD users (e.g., design engineers) can save minutes, hours, and even days of work otherwise spent manually updating the 3D model.

According to an example embodiment, a computer-implemented method comprises modifying a parent view of a three-dimensional (3D) model in a computer-aided drawing (CAD) system based on user input. The parent view is linked to a child view of the 3D model. The child view is created from the parent view. The user input is provided to the CAD system. The computer-implemented method further comprises modifying the child view, automatically, in accordance with the parent view modified. It should be understood that each action performed by the computer implemented method is performed by a computer processor in an automated way.

The parent view may be a 3D view. The 3D view may include a saved view of the 3D model and a presentation state of the 3D model. The saved view may include a retrievable view orientation (e.g., front, back, right-side, left-side, etc. for non-limiting example) of the 3D model. The presentation state is a retrievable state of the 3D model. Modifying the parent view may include modifying the saved view, presentation state, or combination thereof. Modifying the saved view, presentation state, or combination thereof, may include altering a display of the 3D model by changing a model geometry (e.g., face color, material, view zoom level, the retrievable view orientation, other feature of the 3D model, or combination thereof). The display of the 3D model is a visualization of the 3D model shown on-screen in response to activation of the parent view.

Changing the model geometry (e.g., 3D shape) may include suppressing at least a portion of the 3D model presented within the display, unsuppressing the at least a portion, showing or hiding the at least a portion, or changing configuration of the model geometry.

The computer-implemented method may further comprise creating the parent view, creating the child view, and linking the child view created to the parent view created. The parent view created has a primary view orientation. The child view created may be oriented at an orthogonal or other axonometric direction that has a locked relationship with the primary view orientation of the parent view created. Creating the child view may include creating the child view from a projection of the 3D model.

The child view may be offset by a rotational offset and angular offset relative to the parent view. Modifying the parent view may include applying a change to a parent view orientation of the parent view. Modifying the child view may include offsetting a child view orientation of the child view, spatially, in order to cause the child view to remain at the rotational and angular offsets relative to the parent view following the change to the parent view orientation.

The parent view and child view may be 3D views or two-dimensional (2D) views. The parent view may include an annotation with an annotation orientation (e.g., horizontal, vertical, etc. for non-limiting example). The annotation orientation enables the annotation to be attached to a model geometry of the 3D model and aligned to a parent view orientation of the parent view of the 3D model. The annotation orientation further enables the annotation to be aligned with a readable direction (e.g., a vector for non-limiting example) of the parent view orientation. Modifying the parent view may include changing the parent view orientation to a new parent view orientation.

The computer-implemented method may further comprise detecting that the parent view orientation of the parent view has been modified and determining whether the new parent view orientation enables (i) the annotation to remain attached to the model geometry and (ii) the annotation to be aligned with the new parent view orientation in a manner that enables the annotation to be aligned with the readable direction to enable readability of the annotation. In an event the determining concludes that the new parent view orientation does not enable (i) and (ii), then the computer-implemented method may further comprise identifying the annotation, visibly, via a change in color, graphical icon (generally indicia), or other visual modification to the annotation, deleting the annotation, ignoring the annotation, or moving the annotation, automatically (responsively), to the child view or to a given view in an event the child view or given view enables (i) and (ii). It should be understood that each of the identifying, deleting, ignoring, and moving actions of the computer-implemented method are performed automatically by a computer processor.

In an event the determining concludes that the new parent view orientation does enable (i) and (ii), the computer-implemented method may further comprise changing the annotation orientation to a new annotation orientation that is offset, spatially, relative to a new view direction of the new parent view orientation, via a rotational offset and angular offset, enabling (ii) while maintaining (i).

The computer-implemented method may further comprise querying a zoom level for the parent view. In an event the new annotation orientation causes the annotation to be positioned in a manner that does not enable display of the annotation in the parent view, the computer-implemented method may further comprise repositioning the annotation so that it is offset from the 3D model in a readable manner outside the model geometry and within the zoom level queried. The repositioning enables the annotation to be displayed in the parent view responsive to activation of the parent view.

The parent view may include a first saved view of the 3D model and a first presentation state of the 3D model. The child view may include a second saved view of the 3D model and a second presentation state of the 3D model. Modifying the parent view may include modifying the first saved view, first presentation state, or combination thereof. Modifying the child view may include modifying the second saved view and second presentation state responsive to and in accordance with the first saved view modified and second presentation state modified, respectively.

The first and second saved views may include respective retrievable orientations of the 3D model. The first and second presentation states may include respective retrievable states of the 3D model.

According to another example embodiment, a computer-aided design (CAD) system comprises a memory and a processor. The processor is configured to modify a parent view of a three-dimensional (3D) model based on user input provided to the CAD system. The parent view is linked to a child view of the 3D model. The child view is created from the parent view. The 3D model is stored in the memory. The processor is further configured to modify the child view, automatically, in accordance with the parent view modified.

Alternative system embodiments parallel those described above in connection with the example method embodiment.

According to another example embodiment, a non-transitory computer-readable medium having encoded thereon a sequence of instructions which, when loaded and executed by a processor, causes the processor to modify a parent view of a three-dimensional (3D) model in a computer-aided drawing (CAD) system based on user input. The parent view is linked to a child view of the 3D model. The child view is created from the parent view. The user input is provided to the CAD system. The sequence of instructions further causes the processor to modify the child view, automatically, in accordance with the parent view modified.

According to another example embodiment, a computer-implemented method comprises detecting that an original orientation of a view of a three-dimensional (3D) model in a computer-aided drawing (CAD) system has been changed to a new orientation. The 3D model has a model geometry (e.g., 3D shape) defined in the CAD system. The view includes an annotation aligned with the original orientation in a manner enabling the annotation to be attached to the model geometry of the 3D model within the view. The computer-implemented method further comprises determining, in response to the detecting, whether the annotation is aligned with the new orientation, and automatically repositioning the annotation within the view based on the determining concluding that the annotation is not aligned with the new orientation. It should be understood that each action performed by the computer implemented method is performed by a computer processor in an automated way.

The view may be a 3D view or two-dimensional (2D) view. The view may be a parent view or child view. The child view is created from the parent view and linked to the parent view.

The new orientation is associated with a readable direction. The repositioning may be further based on determining that the new orientation enables: (i) the annotation to remain attached to the model geometry, and (ii) the annotation to be aligned with the new orientation in a manner that enables the annotation to be aligned with the readable direction to enable readability of the annotation. In event the determining concludes that the new orientation does not enable (i) and (ii), then the computer-implemented method may further comprise automatically (responsively) performing one of: identifying the annotation, deleting the annotation, ignoring the annotation, or moving the annotation. It should be understood that each of the identifying, deleting, ignoring, and moving actions of the computer-implemented method are performed automatically by a computer processor. The identifying may include identifying the annotation visibly, via a change in color, graphical icon (generally indicia), or other visual modification to the annotation. The moving may include moving the annotation, automatically, to a different view of the 3D model that enables (i) and (ii).

Moving the annotation, automatically, to the different view may be based on a setting in the CAD system. The setting may be configurable by a user of the CAD system.

In an event the determining concludes that the new orientation does enable (i) and (ii), the repositioning may include changing an original annotation orientation of the annotation to a new annotation orientation that is offset, spatially, relative to the new orientation of the view of the 3D model, via a rotational offset and angular offset, enabling (ii) while maintaining (i).

The computer-implemented method may further comprise querying a zoom level for the view. In an event the new annotation orientation causes the annotation to be positioned in a manner that does not enable display of the annotation in the view, the repositioning may include repositioning the annotation so that it is offset from the 3D model in a readable manner outside the model geometry and within the zoom level queried. The repositioning enables the annotation to be displayed in the view responsive to activation of the view.

The annotation may be a given annotation of a plurality of annotations attached to the model geometry of the 3D model within the view. The determining and repositioning actions may be performed for each annotation of the plurality of annotations.

In an event the new orientation causes the annotation to be located inside the model geometry of the 3D model or otherwise obscured, visibly, within the view, the repositioning may include repositioning the annotation to be offset relative to the model geometry of the 3D model in a readable manner outside the model geometry.

The computer-implemented method may further comprise querying a zoom level of the view. Repositioning the annotation to be offset relative to the model geometry of the 3D model in the readable manner may be based on the zoom level queried to enable the annotation to be displayed on-screen in response to activation of the view.

According to another example embodiment, a computer-aided design (CAD) system comprises a memory and a processor. The processor is configured to detect that an original orientation of a view of a three-dimensional (3D) model in the CAD system has been changed to a new orientation. The 3D model has a model geometry defined in the memory. The view includes an annotation aligned with the original orientation in a manner enabling the annotation to be attached to the model geometry of the 3D model within the view. The processor is further configured to determine, in response to detecting that the original orientation has been changed, whether the annotation is aligned with the new orientation, and to automatically reposition the annotation within the view based on determining that the annotation is not aligned with the new orientation.

Alternative system embodiments parallel those described above in connection with the example method embodiments.

According to yet another example embodiment, a non-transitory computer-readable medium having encoded thereon a sequence of instructions which, when loaded and executed by a processor, causes the processor to detect that an original orientation of a view of a three-dimensional (3D) model in a computer-aided drawing (CAD) system has been changed to a new orientation. The 3D model has a model geometry defined in the CAD system. The view includes an annotation aligned with the original orientation in a manner enabling the annotation to be attached to the model geometry of the 3D model within the view. The sequence of instructions further causes the processor to determine, in response to detecting that the original orientation has been changed, whether the annotation is aligned with the new orientation, and to automatically reposition the annotation within the view based on determining that the annotation is not aligned with the new orientation.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference

FIGS. 9A-E are block diagrams of example embodiments of parent and child views.

FIGS. 10A-G are block diagrams portraying a workflow example of creating a child view according to an example embodiment disclosed herein.

FIGS. 11A-G are block diagrams portraying a non-limiting workflow example of editing a parent view and child view thereof according to an example embodiment disclosed herein.

FIG. 12 is a block diagram of an example embodiment of the parent and child views modified as disclosed with regard to FIGS. 10A-G and 11A-G.

DETAILED DESCRIPTION

Figure 1A:
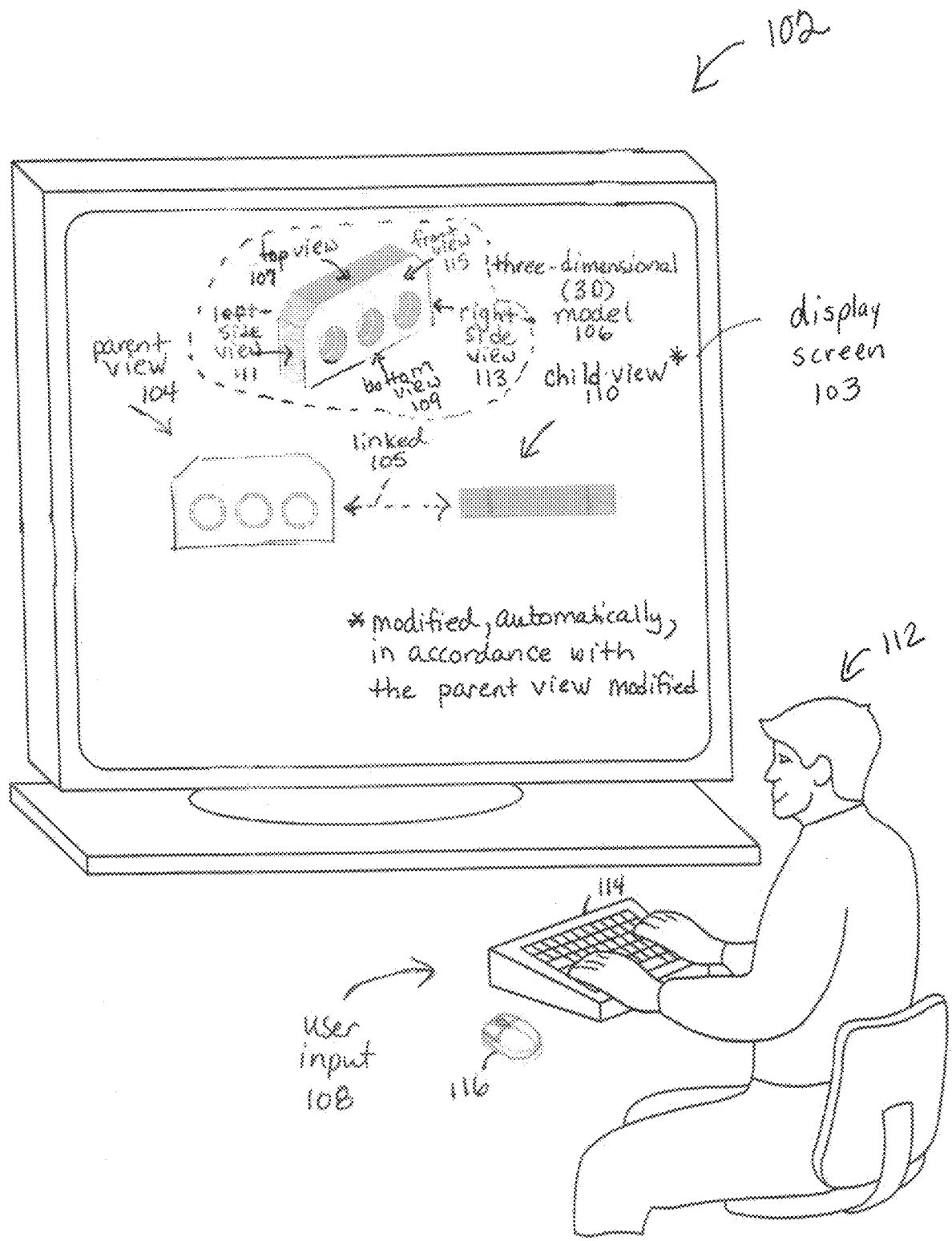
FIG. 1A is a block diagram of an example embodiment of a computer-aided design (CAD) system.

A description of example embodiments follows.

Three-dimensional (3D) models in computer-aided design (CAD) systems may include saved views and presentation states, as defined in standards published by the American Society of Mechanical Engineers (ASME), such as ASME Y14.41 and ASME Y14.47 for non-limiting example. Saved views are retrievable orientations of the 3D model. Presentation states are retrievable states of the 3D model. While such saved views and presentation states may be combined, each of these views/states are individually retrievable and independent from each other in the art. If such views/states are updated to have a different display of the 3D model, other views/states within that 3D model are not updated in kind. For example, the display of the model may be modified such that it has a different displayed geometry (e.g., 3D shape). Such modification may be based on user input to the CAD system that causes, for non-limiting example, suppression/unsuppression of an element of the 3D model, show/hide of the element, a change to the configuration, face color(s), material(s), view orientations, view zoom level, etc. of the 3D model.

2D drawings are separate entities that indirectly show various elements of the 3D model on a 2D sheet. When working in the 3D model in a CAD system, however, there is no such separation. There are no analogs for 2D behavior currently possible when working directly in the 3D models. As such, if a change is required across several specifically associated views/states, the user is forced to individually update all views/states in the 3D model. Further, in 2D drawings, when a 2D view orientation of a parent 2D view or child 2D view is changed, annotations within the 2D view are not translated to the new orientation. Typical behavior is that such annotations are simply removed from the 2D view after the view's orientation is changed. The user is also forced to update the position and orientation of all annotations whose orientations become outdated when the views/states are changed. An example embodiment advantageously performs such updating of views/states and annotations thereof, automatically, saving a CAD design engineer time and preventing inaccuracies resulting from manual effort.

Users who transition from a 2D drawing implementation to adopt Model-based Definition still expect analogs for behaviors and functions to which they are accustomed on 2D drawings. Currently, for many behaviors and functions, there are no analogs. Since the 3D modelling environment is a significantly different experience from that of 2D drawings, new solutions disclosed herein are useful to fulfill the need to create such analogs. An example embodiment further leverages strengths of the 3D modelling environment for new abilities that exceed anything previously possible in both 2D drawing and 3D models.

An example embodiment resolves the issue of not being able to link views/states within the 3D modelling environment and further assists a user by automatically repositioning and reorienting annotations aligned and applied to those views/states. Filling of this current gap can save users minutes, hours and even days of work in the most complex of cases.

FIG. 1A is a block diagram of an example embodiment of a computer-aided design (CAD) system 102 that comprises a memory and a processor, such as the memory 1308 and processor 1318 of FIG. 13 described further below for non-limiting example. The CAD system 102 includes a display screen 103 (i.e., screen view) with a three-dimensional (3D) model 106, parent view 104 of the 3D model, and child view 110 created from the parent view 104 displayed thereon. Such elements visualized on the display screen 103 may be displayed via a CAD application executing on the CAD system 102 for non-limiting example.

It should be understood that 3D models, parent views, and child views as illustrated in figures of the disclosure are for non-limiting example. In the example embodiment of FIG. 1A, the parent view 104 is created from the 3D model 106 and presents the front view 115 of the 3D model 106. The child view 110 is created from an existing projection (e.g., user perspective of the 3D model) of the parent view 104, namely the top view 107 of the 3D model 106 for non-limiting example. According to the example embodiment, the processor is configured to modify the parent view 104 of the 3D model 106 based on user input 108 provided to the CAD system 102. The user input 108 may be input by a user 112 via an input device, such as the keyboard 114 and/or mouse 116 that may interface with the CAD system 102 via an input/output (I/O) interface, such as the I/O interface 1304 of FIG. 13, described further below for non-limiting example.

It should be understood that the user input 108 is not limited to being input via the keyboard 114 and/or mouse 116. Continuing with FIG. 1A, the parent view 104 is linked 105 to a child view 110 of the 3D model 106. The parent view 104 may be linked 105 to the child view 110 using known or common techniques, such as by associating a reference of the child view 110 with the parent view 104 in the memory for non-limiting example. Such reference may be an identifier (ID) or memory address of the child view 110 in the memory for non-limiting example. The child view 110 is created from the parent view 104. The 3D model 106 is stored in the memory. The processor is further configured to modify the child view 110, automatically, in accordance with the parent view 104 modified, such as disclosed below with regard to FIG. 1B.

Figure 1B:
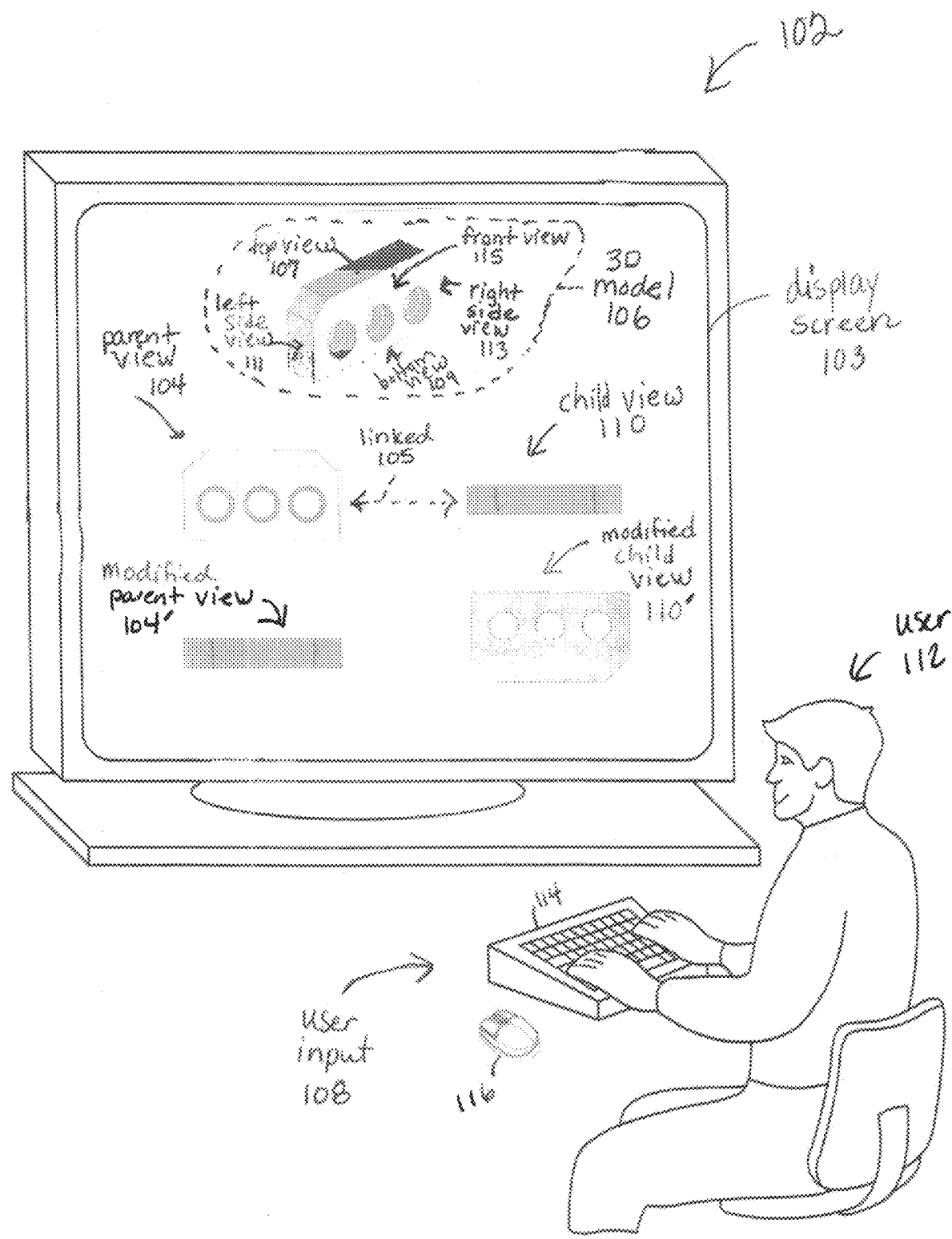
FIG. 1B is a block diagram of an example embodiment of the CAD system of FIG. 1A.

FIG. 1B is a block diagram of an example embodiment of the CAD system 102 of FIG. 1A. In the non-limiting example embodiment of FIG. 1B, the display screen 103 shows a modified parent view 104' of the parent view 104. The modified parent view 104' was produced by modifying the parent view 104. The display screen 103 further shows a modified child view 110' produced by modifying the child view 110, automatically, in accordance with the parent view 104 modified. In the example embodiment of FIG. 1B, the parent view 104 has been modified from one projection, namely from the front view 115, to another projection, namely the top view 107 which then becomes the new front view.

The child view 110 is modified, automatically, according to the parent view 104 modified. For example, the projection selected previously for the child view 110 was the top view 107. Since the front view 115 has become the new bottom view and the former top view 107 has become the new front view for the parent view 104, as shown in the modified parent view 104', the child view 110 is updated in kind to present the new top view in the modified child view 110', namely, to present the former back view of the 3D model 106.

The parent view 104 may be a 3D view. The 3D view may include a saved view (not shown) of the 3D model 106 and a presentation state (not shown) of the 3D model 106. The presentation state may be a retrievable state of the 3D model 106. To modify the parent view 104, the processor may be further configured to modify the saved view, presentation state, or combination thereof. Saved views and presentation states of 3D models are known in the art and are further defined in standards, such as ASME Y14.41 and ASME Y14.47 for non-limiting example.

According to an example embodiment, the parent view 104 may include an annotation with an annotation orientation (e.g., horizontal, vertical, etc. for non-limiting example), such as shown in FIGS. 5 and 6A–C, disclosed further below for non-limiting example. The annotation orientation enables the annotation to be attached to a model geometry of the 3D model 106 and aligned to a parent view orientation (e.g., front, back, top, etc. for non-limiting example) of the parent view of the 3D model 106. The annotation orientation further enables the annotation to be aligned with a readable direction (e.g., horizontal, vertical, etc. for non-limiting example) of the parent view orientation. To modify the parent view 104, the processor may be further configured to change the parent view orientation to a new parent view orientation, such as described further below with regard to FIG. 5 and FIGS. 6A–C. The processor may be further configured to detect that the parent view orientation of the parent view 104 has been modified. The processor may be further configured to determine whether the new parent view orientation enables (i) the annotation to remain attached to the model geometry and (ii) the annotation to be aligned with the new parent view orientation in a manner that enables the annotation to be aligned with the readable direction to enable readability of the annotation, for example, when presented on-screen to the user 112.

In an event the processor determines that the new parent view orientation does not enable (i) and (ii), the processor may be further configured to: (a) identify the annotation, visibly, via a change in color, graphical icon, or other visual modification to the annotation, (b) delete the annotation, (c) ignore the annotation, or (d) move (e.g., transfer) the annotation, automatically and responsively, to the child view or to a given view in an event the child view or given view enables (i) and (ii). In an event the determining concludes that the new parent view orientation does enable (i) and (ii), the processor may be further configured to change the annotation orientation to a new annotation orientation that is offset, spatially, relative to a new view direction of the new parent view orientation, via a rotational offset and angular offset, enabling (ii) while maintaining (i). It should be understood that the performance of (a), (b), (c) and (d) and other aligning of an annotation disclosed herein is not by the user 112 manually interfacing with the CAD system 102 and 'manually' adjusting the annotation.

The processor may be further configured to query a zoom level for the parent view 104. In an event the new annotation orientation causes the annotation to be positioned in a manner that does not enable display of the annotation in the parent view 104, the processor may be further configured to reposition the annotation so that it is offset from the 3D model in a readable manner outside the model geometry and within the zoom level queried. The annotation may be repositioned in a manner enabling the annotation to be displayed in the parent view 104 responsive to activation of the parent view 104.

The parent view 104 may include a first saved view of the 3D model 106 and a first presentation state of the 3D model 106. The child view 110 may include a second saved view of the 3D model 106 and a second presentation state of the 3D model 106. To modify the parent view 104, the processor may be further configured to modify the first saved view, first presentation state, or combination thereof. To modify the child view 110, the processor may be further configured to modify the second saved view and second presentation state responsive to and in accordance with the first saved view modified and first presentation state modified, respectively, of the parent view modified. The first and second saved views may include respective retrievable orientations of the 3D model 106, and the first and second presentation states may include respective retrievable states of the 3D model 106.

In the 3D modelling environment of the CAD system 102, the child view 110 may be created from the parent view 104, automatically, by a computer-implemented method 200, such as disclosed below with regard to FIG. 2.

Figure 2:
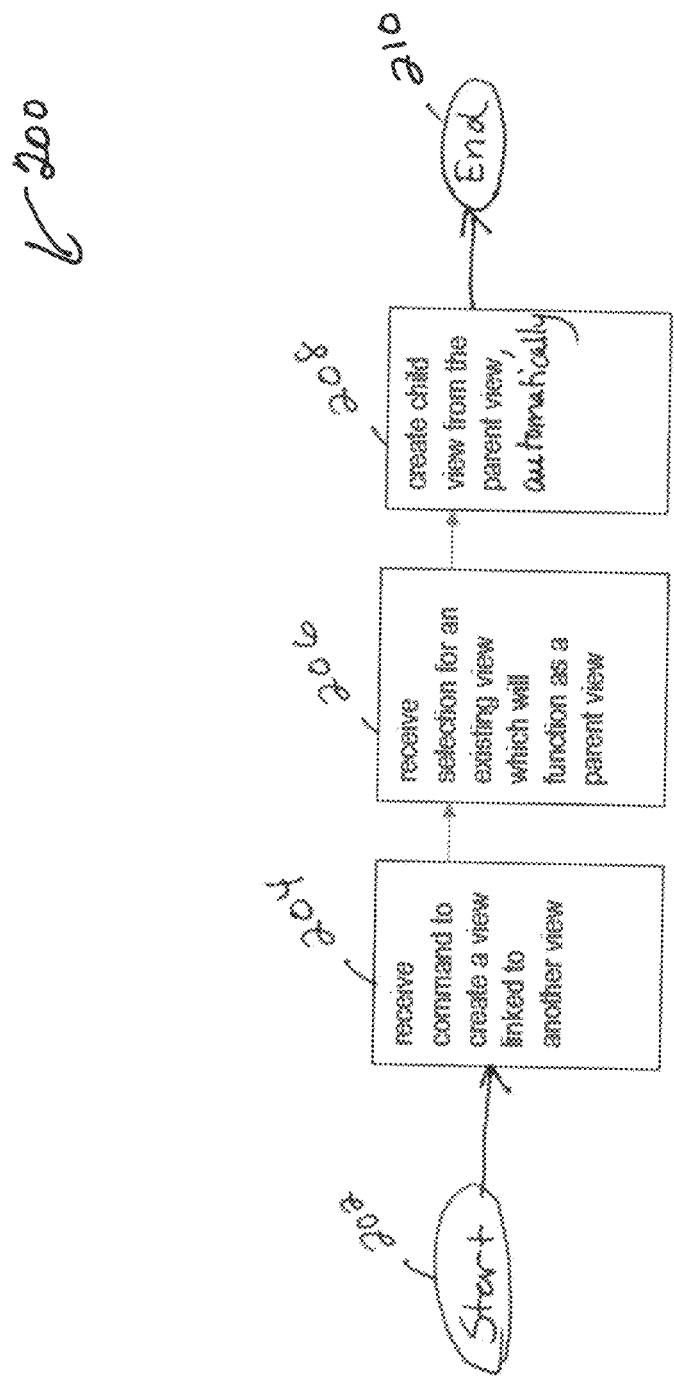
FIG. 2 is a flow diagram of an example embodiment of a computer-implemented method for creating a child view.

FIG. 2 is a flow diagram of an example embodiment of a computer-implemented method 200 for creating a child view, such as the child view 110 disclosed above for non-limiting example. The method begins (202) and receives (204) a command to create a view linked to another view. The command may be entered, for non-limiting example, by the user 112 via the keyboard 114 of FIG. 1A, disclosed above. It should be understood that such command may be entered by the user 112 via another electronic input device, such as microphone or touch screen for non-limiting example. The method may receive a selection (206) for an existing view which will function as the parent view, such as the parent view 104 of FIGS. 1A and 1B, disclosed above. The method may automatically create (208) the child view from the parent view selected at 206. The method thereafter ends (210), in the example embodiment.

Referring back to FIG. 1B, the parent view 104 and child view 110 created therefrom may be 3D views or two-dimensional (2D) views (e.g., 2D drawings). A view, as disclosed herein, may be referred to interchangeably as a view/state which refers to the view in combination with its respective presentation state. Each view/state, such as the parent view 104 in combination with its respective presentation state, and the child view 110 in combination with its respective presentation state, has its own orientation and other characteristics within the 3D model 106. Views/states can include, for non-limiting example, respective annotations, such as disclosed further below with regard to FIGS. 4, 5, and 6A-C. If the user 112 wishes to reorganize such views/states (e.g., in a feature tree for non-limiting example) while keeping annotations organized in association to their views/states, an example embodiment enables same in an automated manner and, as such, the user 112 does not have to change the orientation, other characteristic, or annotation of each views/states manually, and individually.

Figure 3:
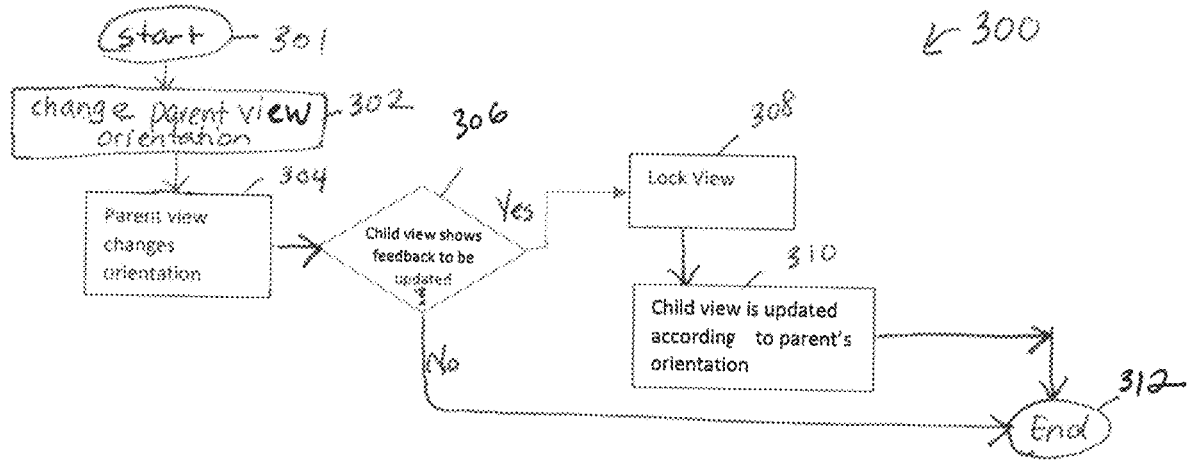
FIG. 3 is a flow diagram of an example embodiment of a computed-implemented method that changes a parent view orientation and impacts a child view linked to the parent view.

FIG. 3 is a flow diagram of an example embodiment of a computer-implemented method 300 that changes a parent view orientation and impacts a child view linked to the parent view (such as by method 200 described above in FIG. 2). The method 300 begins (301) and the processor receives (302) a command to change the parent view orientation, for example, based on user input to a CAD system 102, such as the user input 108 disclosed above with regard to FIGS. 1A and 1B. In response, the processor at step 304 changes the parent view orientation and provides the resulting parent view orientation for method 300. Next at step 306, the processor may query the child view linked to the parent view and determine whether the child view shows feedback that it should be updated. For example, the child view may have associated presentation state that indicates its relative orientation to the parent view is not maintained due to the parent view orientation change at 304, and such indication may serve as the feedback for non-limiting example. If the child view does indicate that an update to same is needed, the method at step 308 may lock the child view, and in turn, the processor at step 310 updates the child view according to the parent's (i.e., parent view's) orientation that was changed by step 304. The method 300 thereafter ends (312) in the example embodiment.

According to an example embodiment, parent views/states may be created by a computer-implemented method in the 3D modelling environment, and then the method may create or assign children views/states whose parent view/states are at an orthogonal (or any other axonometric) direction in locked relation with a primary orientation (e.g., front view, top view, etc.) of the parent view/states. When the parent view/state orientation is changed, an example embodiment of the computer-implemented method may query the model and previous parent view/state orientation, then query the model and current parent view/state orientation, then apply an angular and rotational difference determined based on same as an offset to all children views/states. In this way, the children views/states maintain their relative orientation and rotation to their parent view/state. An example embodiment of the method may prevent the user 112 from causing a change to the initial orientation of the child views/states directly.

For example, with reference to FIG. 1B, the parent view/state may be oriented to display the front view 115 of the 3D model 106, such as shown via the parent view 104, and then one child view/state may be orientated to display the left-side view 111 of the 3D model 106, and another child view/state may display the top view 107 of the 3D model 106, such as shown via the child view 110 visualized on the display screen 103 of the CAD system 102 in FIG. 1B for non-limiting example. When the parent view/state is retrieved, the user 112 may initially see the front view 115 of the 3D model 106 displayed on-screen, such as shown by way of the parent view 104 visualized on the display screen 103 of the CAD system 102 of FIG. 1B for non-limiting example.

When the left view/state is retrieved, the user 112 may see the left-side view 111 of the 3D model displayed on-screen, etc. The user 112 may cause a change to the orientation (e.g., via the user input 108) of the parent view 104 to change the orientation of the parent view 104 from the front view 115 of the 3D model 106 to left-side view 111 of the 3D model 106. In this case, the left view/state would be forced to become the back view of 3D model 106, but the top view/state remains the top view 107 of 3D model 106. However, embodiments rotate the orientation of the top view/state to align with the new orientation of the parent view/state. As described above, this may be accomplished by offsetting the orientation of child view/state spatially so that it always remains at the same rotational and angular offset from the parent views/states linked thereto.

According to an example embodiment, child views/states may match their respective parent view/state's characteristics, such as displayed geometry (e.g., 3D shape with its associated suppressed/unsuppressed, show/hide, configuration, etc. of elements), face colors, materials, view orientations, view zoom level, etc. If, for non-limiting example, the material of the 3D model 106 is changed from stainless steel to aluminum in the parent view/state, it is so changed in the children views/states. This may be to the exclusion of other parent views/states and their children views/states within the same model. According to an example embodiment, a configurable setting in the CAD system 102 may enable 3D model characteristics to be changed indiscriminately to the individually retrievable view/states (all are changed or none are changed), or only apply the change to an individual view/state (each view/state is managed separately without view/state parent and child relationships).

The saved view may include a retrievable view orientation of the 3D model 106. To modify the saved view, presentation state, or combination thereof, the processor may be further configured to alter a display of the 3D model 106 by changing a model geometry, face color, material, view zoom level, the retrievable view orientation, other feature of the 3D model 106, or combination thereof. The display of the 3D model 106 may be a visualization of the 3D model 106 shown on-screen in response to activation of the parent view 104, such as shown on the display screen 103 for non-limiting example.

Changing the model geometry may include suppressing at least a portion of the 3D model 106 presented within the display (e.g., display screen 103), unsuppressing the at least a portion, showing or hiding the at least a portion, or changing configuration of the model geometry, such as 3D shape, dimension(s), for non-limiting example, or other geometrical information associated with the 3D model 106.

The processor may be further configured to create the parent view 104, create the child view 110, and link the child view 110 created to the parent view 104 created. For example, the linking is accomplished by the processor performing method 200 of FIG. 2. The parent view 104 created may have a primary view orientation (e.g., top, front, bottom, etc. for non-limiting example). The child view 110 created may be oriented at an orthogonal or other axonometric direction that has a locked relationship with the primary view orientation of the parent view 104 created. To create the child view 110, the processor may be further configured to create the child view 110 from a projection of the 3D model 106.

The child view 110 may be offset by a rotational offset and angular offset relative to the parent view 104. To modify the parent view 104, the processor may be further configured to apply a change to a parent view orientation of the parent view 104. To modify the child view 110, the processor may be further configured to offset a child view orientation of the child view 110, spatially, in order to cause the child view 110 to remain at the rotational and angular offsets relative to the parent view 104 following the change to the parent view 104 orientation. For example, the processor performs the method 300 of FIG. 3 to accomplish such updating of the child view according to changed or resulting parent view orientation.

According to an example embodiment, annotations may be included within any saved view (parent or child) and such annotations have respective orientations. Within each view/state, there may be annotations that are attached to the model geometry. When an annotation is attached to the model geometry, it is typically aligned in some manner to an orientation that allows it to be attached to that geometry and readable to the direction of the orientation of the view/state. When the orientation of the view/state is changed, annotations that are aligned to the view/state's original orientation may no longer be aligned to the current (or a resulting) orientation of the view/state.

As such, for each annotation, an example embodiment may detect when a view/state's orientation is changed, then query the annotations to determine which annotations within the view/state should be reoriented to the new orientation (which ones are not aligned to the new orientation of their view/state), rotated (for readable direction), and repositioned within the view/state. An example embodiment may analyze the geometry to which each annotation is attached. For each annotation, an example embodiment may automatically, by a computer processor, find the orientation which will allow the annotation to not only remain attached to the model geometry but to also be aligned to the new view/state orientation and readable direction. If there is no common orientation between the annotation and new orientation of the view/state, an example embodiment may ignore or delete that annotation. If there is a common orientation between the annotation and the new orientation of the view/state, an example embodiment may apply the same angular and rotational offset as described above to change the annotation orientation to that common orientation while keeping the annotation attached to the associated geometry of the 3D model 106.

For each repositioned/reoriented annotation, an example embodiment may query the model and the zoom level of the view/state, then query the annotation's position within its new orientation. If the new position of the repositioned/reoriented annotation is inside of the 3D model 106 or otherwise obscured by geometry, or if the annotation is positioned so far away from the 3D model 106 that the annotation does not appear on-screen, then an example embodiment may automatically reposition the annotation so that it appears offset from the 3D model 106 in a readable manner outside of the model geometry and within the view/state's zoom level so that the annotation appears on-screen when its view/state is activated.

For annotations that cannot be reoriented and are not aligned to the new orientation of the view/state, if they are not deleted, an example embodiment may identify these annotations in some human readable manner, such as by displaying the annotation in a different color or identifying the annotation with a graphical or icon badge. An example embodiment may provide a configurable setting in the CAD system 102 with the option to automatically move these annotations to other views/states where their orientation can be supported.

Figure 4:
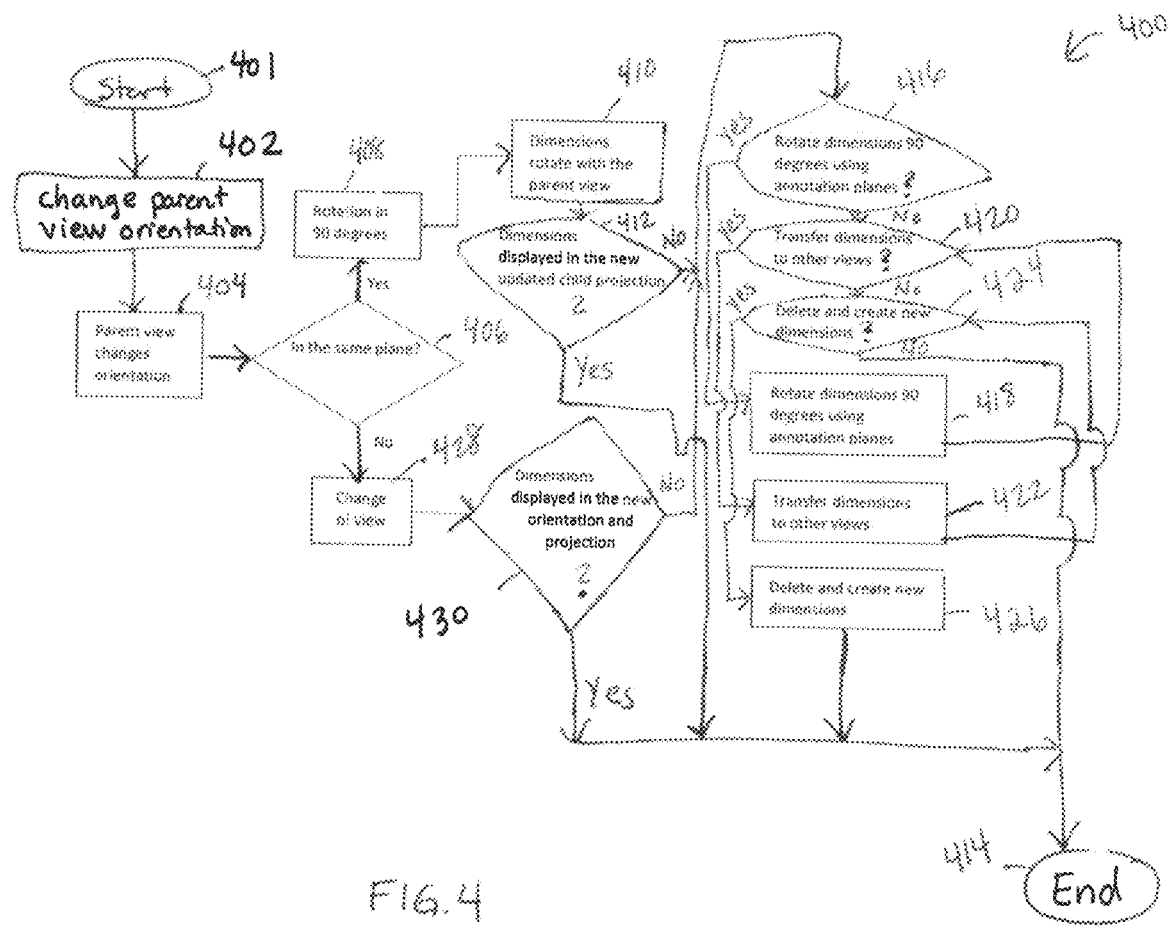
FIG. 4 is a flow diagram of an example embodiment of a computer-implemented method that changes a parent view's orientation and effects change to annotations thereof.

FIG. 4 is a flow diagram 400 of an example embodiment of a computer-implemented method that changes a parent view's orientation and effects change to annotations thereof. In the example embodiment, the annotations indicate dimensions for non-limiting example. Such dimensions have respective dimension lines and a dimension value, as described further below with regard to FIG. 5, and may be referred to simply as dimensions. The method begins (401) and at step 402 the processor receives a command to change the parent view orientation. In response at step 404, the processor changes the parent view orientation from an original orientation to a new orientation. Such change may be based on user input received from a user, such as the user input 108 of FIGS. 1A and 1B, disclosed above. The method 400 may check and determine (406) whether the new orientation is in the same plane as the original orientation. If yes, the processor at step 408 rotates the new orientation relative to the original orientation by ninety degrees, such as disclosed further below with regard to FIG. 5. At step 410, the processor rotates the dimensions with the parent view, such as disclosed further below with regard to FIG. 5.

In the example embodiment of FIG. 4, a child view is linked to the parent view and a projection of the child view is updated to a new updated child projection, such as disclosed below with regard to FIG. 5. The method 400/the processor at 412 may check for whether the dimensions are displayed in the new updated child projection. If yes, the method thereafter ends (414) in the example embodiment.

If, however, any of the dimensions are not displayed, the method 400/processor at 416 may check for whether to rotate any of such dimension(s) ninety degrees using annotation plane(s). If no, the method 400/processor at 420 may check for whether to transfer any of such dimension(s) to another view(s). If yes, however, the method 400/processor may rotate a dimension(s) ninety degrees using the annotation plane(s) (at step 418) and check for whether to transfer a dimension(s) to another view(s) (at step 420).

If the check for whether to transfer a dimension(s) to another view(s) (at step 420) is determined in the negative, the method 400/processor proceeds to step 424 and checks for whether to delete a dimension(s) or whether to create a new dimension(s). If no, the method 400 ends (414). If the check for whether to transfer dimension(s) to another view (s) at step 420 is determined in the positive, however, the method 400/processor may transfer a dimension(s) to another view(s) (at step 422) and check for whether to delete a dimension(s) and/or create a new dimension(s) (at step 424).

If the check for whether to delete a dimension(s) and/or create a new dimension(s) (at step 424) is determined no, the method thereafter ends (414) in the example embodiment. If yes, however, the method 400/processor deletes the dimension(s) and/or creates the new dimension(s) (at step 426) and the method thereafter ends (414) in the example embodiment.

Alternatively, if the check at 406 for whether the new orientation is in the same plane as the original orientation described above is determined no, the method 400/processor changes the view (at step 428) of the parent view and checks for whether dimensions in the new orientation and projection are displayed (at 430). If no, the method 400/processor proceeds as disclosed above with regard to step 416. If yes at step 430, the method thereafter ends (414) in the example embodiment. An example embodiment of a parent view that is changed such that its orientation is rotated in the same plane is disclosed below, with regard to FIG. 5.

Figure 5:
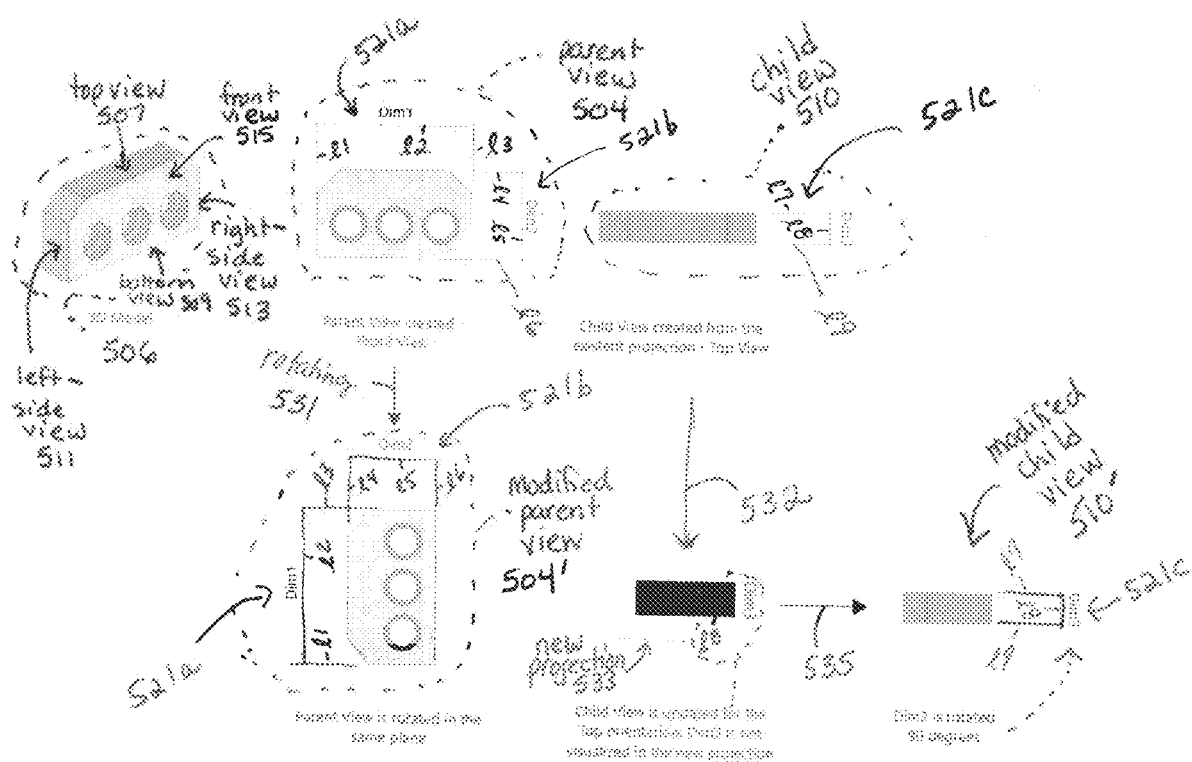
FIG. 5 is a block diagram of an example embodiment of modification to a parent view and child view linked to the parent view.

FIG. 5 is a block diagram of an example embodiment of modification to a parent view 504 and child view 510 linked to the parent view 504 for example by linking method 200 described above in FIG. 2. In the example embodiment of FIG. 5, the parent view 504 is created from a given view, that is, the front view 515, of a plurality of views of a 3D model 506, such as the top view 507, front view 515, left-side view 511, bottom view 509, and right-side view 513 for non-limiting example. In the example embodiment, the parent view 504 includes two annotations applied to the front view 515, namely the first annotation 521*a* and second annotation 521*b*. The first annotation 521*a* includes three respective dimension lines, namely 11, 12, and 13, as well as a respective dimension value (i.e., Dim1) represented by same. The second annotation 521*b* includes three respective dimension lines, namely 14, 15, and 16, as well as a respective dimension value (i.e., Dim2) represented by same.

In the non-limiting example embodiment of FIG. 5, a child view 510 has been created from the parent view 521*a* and is created from an existing projection, namely the top view 507 of the 3D model 506. The child view 510 includes an annotation, namely the third annotation 521*c* that includes three respective dimension lines, namely 17, 18, and 19, as well as a respective dimension value (i.e., Dim3) represented by same. The parent view 504 is linked to the child view 510, and the child view 510 is modified, automatically, in accordance with the parent view 504 modified, to produce the modified child view 510'.

For example, the parent view 504 is modified in the non-limiting example embodiment of FIG. 5 by rotating 531 the parent view 504 in the same plane associated with its original orientation. Such modification produces the modified parent view 504' that includes the first annotation 521*a* and second annotation 521*b* which have been rotated with the rotation of the parent view, such as disclosed above with regard to FIG. 4 and action taken at (410).

The child view 510 is then automatically updated 532 for the top orientation, and the update 532 causes the original orientation to become a new orientation in which the right-side view 513 of the 3D model 506 has become the current top view/state due to the rotation of the parent view 504. Such updating of the child view 510, however, results in the third annotation 521*c* not being visualized properly in the new projection 533 because only the respective value Dim3 and dimension line 18 are shown in the child view 510.

As such, the processor performs a check, such as at (412) of FIG. 4 described above, that checks for whether the third annotation 521*c* is visualized in the new updated child projection (i.e., the new projection 533). In the example of FIG. 5, the processor determines that the third annotation 521*c* is not properly visualized (displayed) and automatically rotates 535 the third annotation 521*c* by ninety degrees in the annotation plane, such as disclosed above with regard to steps 416 and 418 of FIG. 4. The modified child view 510' that results is able to properly visualize the third annotation 521*c* including the three respective dimension lines, namely 17, 18, and 19, as well as a respective dimension value (i.e., Dim3) represented by same, for presentation on-screen.

Figures 6A, 6B, 6C:
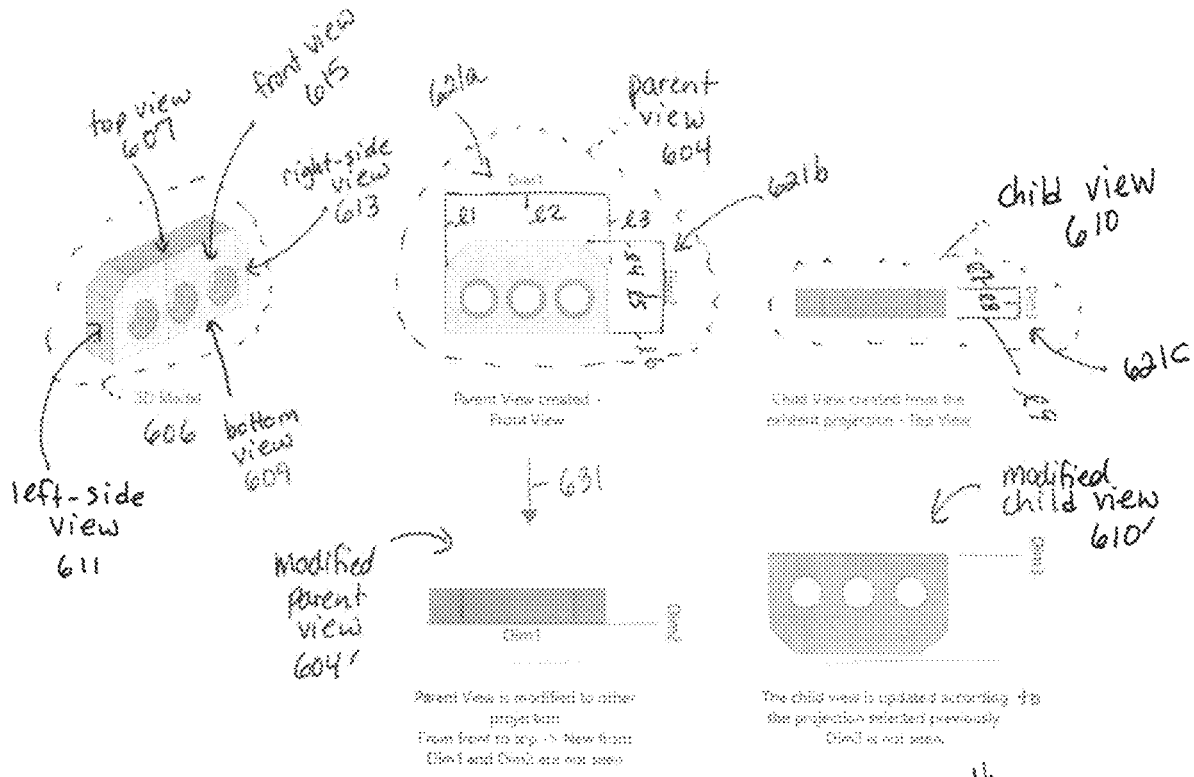
FIGS. 6A-C are block diagrams of additional example embodiments of modification to a parent view and child view linked to the parent view.

FIGS. 6A-C are block diagrams of additional example embodiments of modification to a parent view 604 and child view 610 linked to the parent view 604 of a subject 3D model 606. In the non-limiting example embodiment of FIG. 6A, the parent view 604 is created from a given view, that is, the front view 615, of a plurality of views of subject 3D model 606, such as the top view 607, front view 615, left-side view 611, bottom view 609, and right-side view 613 for non-limiting example. In the example embodiment, the parent view 604 includes two annotations applied to the front view 615, namely the first annotation 621*a* and second annotation 621*b*. The first annotation 621*a* includes three respective dimension lines, namely 11, 12, and 13, as well as a respective dimension value (i.e., Dim1) represented by same. The second annotation 621*b* includes three respective dimension lines, namely 14, 15, and 16, as well as a respective dimension value (i.e., Dim2) represented by same.

In the example embodiment of FIG. 6A, a child view 610 has been created from the parent view 604 and is created from an existing projection, namely the top view 607 of the 3D model 606. The child view 610 includes an annotation, namely the third annotation 621*c* that includes three respective dimension lines, namely 17, 18, and 19, as well as a respective dimension value (i.e., Dim3) represented by same. The parent view 604 is linked to the child view 610 and the child view 610 is modified, automatically, in accordance with the parent view 604 modified, to produce the modified child view 610' using methods 200, 300, and 400 of FIGS. 2, 3, and 5 detailed above.

For example, the parent view 604 is modified in the non-limiting example embodiment of FIG. 6A by changing (631) the parent view 604 orientation to another projection, such as describe above with regard to FIG. 4 at (428). Such modification causes the original orientation of the parent view 604 to change from the front view 615 to the top view 607 of the 3D model 606 and, as such, the top view 607 is the new orientation, that is, the new front view/state for the modified parent view 604'. Such change 631 in orientation, however, prevents the first annotation 621*a* and second annotation 621*b* from being visualized. Further, the child view 610 that is modified, automatically, in accordance with the parent view 604 that is modified, produces the modified child view 610' in which the third annotation 621*c* is no longer visualized. Such annotations may be automatically repositioned in the modified parent view 604' and modified child view 610' such as disclosed above with regard to FIG. 4 and below, with regard to FIG. 6B and FIG. 6C.

In the non-limiting example embodiment of FIG. 6B, display of the annotations of the modified parent view 604' and modified child view 610' is repaired for visualization purposes by automatically repositioning the annotations. In particular, such repositioning includes rotating the annotation plane of the first annotation 621*a*, transferring the second annotation 621*b* from the modified parent view 604' to the modified child view 610', and transferring the third annotation 621*c* from the modified child view 610' to the modified parent view 604'. Such options for addressing display of annotations are among those described above with regard to steps 416, 418, 420, and 422 of FIG. 4.

Alternatively, in the non-limiting example embodiment of FIG. 6C, display of the annotations is shown to be repaired by automatically repositioning annotations by transferring the first annotation 621*a* and second annotation 621*b* to the modified child view 610' and transferring the third dimension 621*c* to the modified parent view 604'.

Referring back to FIGS. 1A and 1B, according to another example embodiment, the processor may be configured to detect that an original orientation of a view, such as the parent view 104 or child view 110, of the 3D model 106 in the CAD system 102 has been changed to a new orientation.

The 3D model 106 has a model geometry defined in the computer or system memory. The view includes an annotation aligned with the original orientation in a manner enabling the annotation to be attached to the model geometry of the 3D model 106 within the view. The processor is further configured to determine, in response to detecting that the original orientation has been changed, whether the associated annotation is aligned with the new orientation, and to automatically reposition the annotation within the view based on determining that the annotation is not aligned with the new orientation, such as disclosed above with regard to FIGS. 5 and 6A-C.

The view may be a 2D drawing that references the 3D model 106. As such, within the 2D drawing, if a 2D view's orientation is changed, annotations may be automatically reoriented and repositioned within the 2D view as they are within a 3D view using the above detailed techniques.

According to an example embodiment, the new orientation may be associated with a readable direction. In turn, the processor may be further configured to reposition the annotation based on determining that the new orientation enables (i) the annotation to remain attached to the model geometry and (ii) the annotation to be aligned with the new orientation in a manner that enables the annotation to be aligned with the readable direction to enable readability of the annotation.

In an event the processor concludes that the new orientation does not enable (i) and (ii) based on the determining, the processor may be further configured to automatically perform one of: identifying the annotation, deleting the annotation, ignoring the annotation, or moving the annotation. The identifying may include identifying the annotation visibly to the user 112, via a change in color, graphical icon, or other visual modification to the annotation. The moving may include moving (e.g., transferring) the annotation, automatically, to a different view of the 3D model that enables (i) and (ii). The moving may be based on a setting in the CAD system 102. The setting may be configurable by the user 112 of the CAD system 102. It should be understood that each of the identifying, deleting, ignoring, and moving actions are performed automatically by the processor.

In an event the processor concludes that the new orientation does enable (i) and (ii) based on the determining, the processor may be further configured to automatically reposition the annotation based on changing an original annotation orientation of the annotation to a new annotation orientation that is offset, spatially, relative to the new orientation of the view of the 3D model 106, via a rotational offset and angular offset, enabling (ii) while maintaining (i).

The processor may be further configured to query a zoom level for the view. In an event the new annotation orientation causes the annotation to be positioned in a manner that does not enable display of the annotation in the view, such as disclosed above with regard to FIGS. 5 and 6A-C, the processor may be further configured to reposition the annotation so that it is offset from the 3D model 106 in a readable manner outside the model geometry and within the zoom level queried, enabling the annotation to be displayed in the view responsive to activation of the view.

The annotation may be a given annotation of a plurality of annotations attached to the model geometry of the 3D model 106 within the view. The processor may be further configured to perform the determine and reposition actions for each annotation of the plurality of annotations, such as disclosed above with regard to FIGS. 5 and 6A-C for non-limiting example.

In an event the new orientation causes the annotation to be located inside the model geometry of the 3D model 106 or otherwise obscured, visibly, within the view, the processor may be further configured to reposition the annotation to be offset relative to the model geometry of the 3D model 106 in a readable manner outside the model geometry.

The processor may be further configured to query a zoom level of the view. To automatically reposition the annotation, the processor may be further configured to reposition the annotation to be offset relative to the model geometry of the 3D model 106 in the readable manner based on the zoom level queried to enable the annotation to be displayed on-screen in response to activation of the view.

As such, as disclosed above, an example embodiment provides the user 112 with the ability to interact with a parent view/state and have changes automatically propagated to children views/states. Additionally, when such propagation occurs, annotations (with their own orientations and readable directions that were originally set by the user 112 to align to the previous conditions of the view/states) have their orientations, positions and readable directions automatically updated to align with the new conditions of the views/states.

Figure 7:
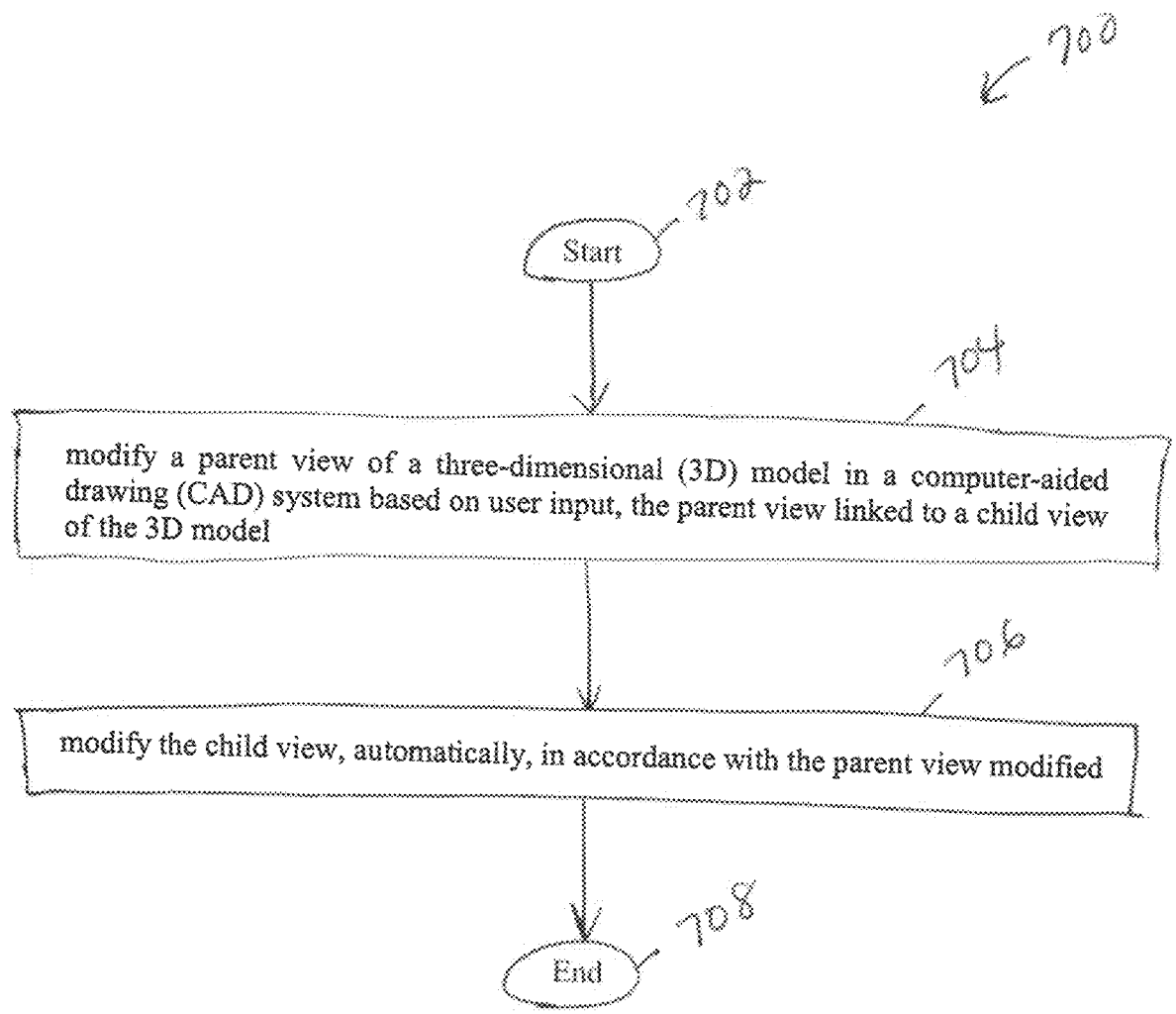
FIG. 7 is a flow diagram of an example embodiment of a computer-implemented method.

FIG. 7 is a flow diagram 700 of an example embodiment of a computer-implemented method. The method begins (702) and modifies (704) a parent view of a three-dimensional (3D) model in a computer-aided drawing (CAD) system based on user input, the parent view linked to a child view of the 3D model (such as by method 200 of FIG. 2), the child view created from the parent view, the user input provided to the CAD system. At step 706, the method 700 modifies the child view, automatically, in accordance with the parent view modified (such as by methods 300, 400 of FIGS. 3 and 4, and techniques described in FIGS. 5 and 6A-6C), and the method 700 thereafter ends (708) in the example embodiment. It should be understood that each action performed by the computer implemented method 700 is performed by a computer processor in an automated way.

Figure 8:
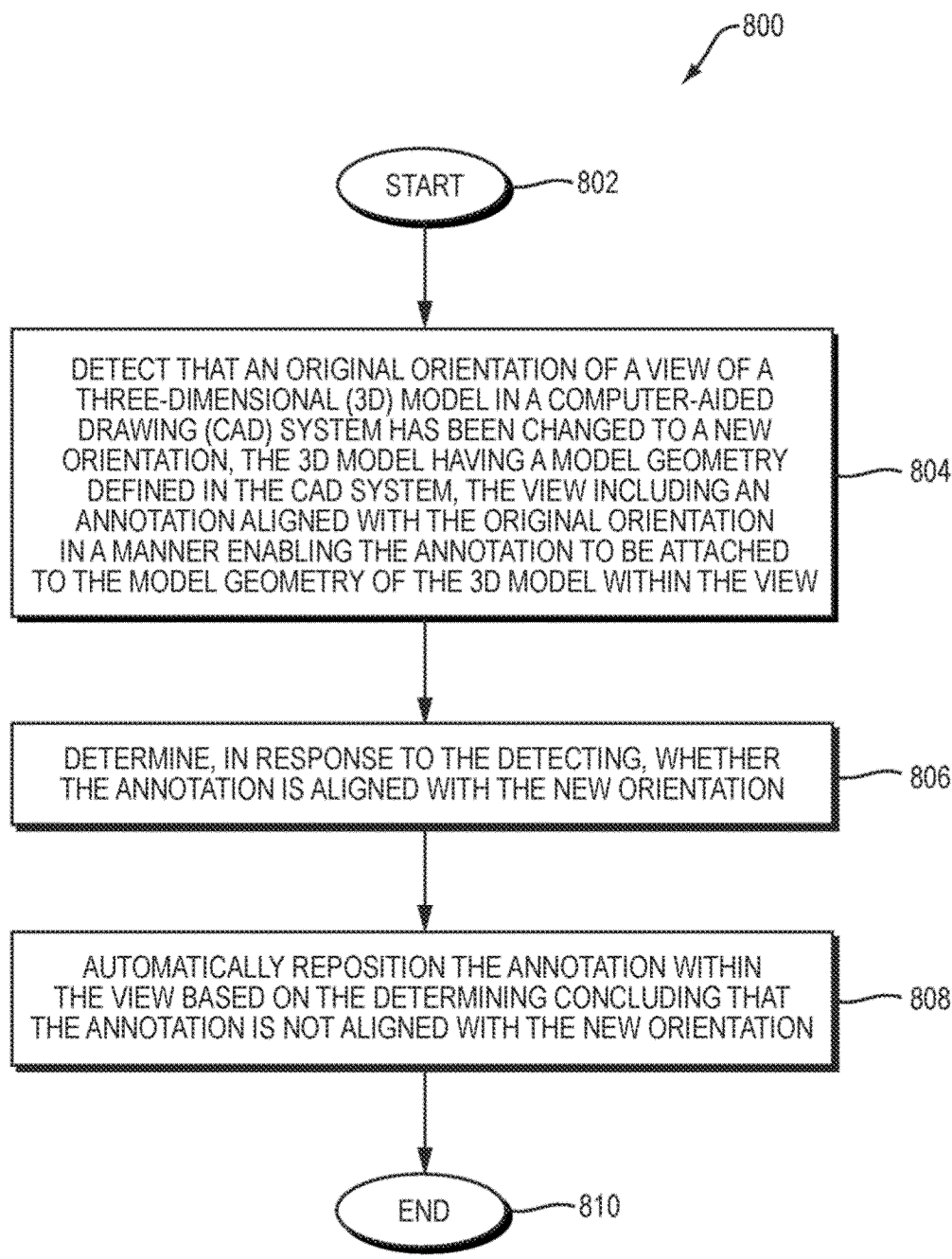
FIG. 8 is a flow diagram of another example embodiment of a computer-implemented method.

FIG. 8 is a flow diagram 800 of another example embodiment of a computer-implemented method. The method begins (802) and detects (804) that an original orientation of a view of a three-dimensional (3D) model in a computer-aided drawing (CAD) system has been changed to a new orientation, the 3D model having a model geometry defined in the CAD system, the view including an annotation aligned with the original orientation in a manner enabling the annotation to be attached to the model geometry of the 3D model within the view. Next, the method 800 determines (806), in response to the detecting of 804, whether the annotation is aligned with the new orientation, and automatically repositions (808) the annotation within the view based on the determining concluding that the annotation is not aligned with the new orientation. The method thereafter ends (810) in the example embodiment. It should be understood that each action 802, 804, 806, 808, 810 performed by the computer implemented method 800 is performed by a computer processor in an automated way.

FIGS. 9A-E are block diagrams of example embodiments of parent and child views. In the example embodiment of FIG. 9A, a 3D model 906 is shown that may be manipulated in a CAD application executed by a processor in a 3D CAD system, such as the CAD system 102 of FIGS. 1A and 1B, disclosed above. It should be understood that the 3D model 906, as illustrated, is for non-limiting example. In the example embodiment of FIG. 9A, a user, such as the user 112 described above, has selected the front view 915 of the 3D model 906 as the respective projection of the parent view 904a (also referred to herein as the "driver" view). According to an example embodiment, if the angle of such view is changed, it will be cause an update, automatically by a processor, to the new orientation's projection selected.

FIG. 9A further includes a child view 910a (also referred to herein as the "driven" view). According to an example embodiment, if the parent view 904a changes, the orientation of the child view 910a remains the same, which is the top orientation in the example embodiment. The geometry visualized, is however updated automatically by the processor to the new orientation of the parent view 904a. The child view 910a is created by the processor from the parent view 904a and, in the example embodiment, has a selected projection, namely the top projection of the 3D model 906, that is, the top view 907.

With reference to FIGS. 1A, 1B, and 9A, in an event the user 112 changes the angle of view of the front view 915, the parent view 904a visualizes the front view 915 with the new orientation that is updated relative to an original orientation. The parent view 904a will be updated by the processor to visualize the new orientation's projection selected by the user 112. Such a change to the driver view causes the driven view to be updated automatically in response to same. In the driven view, that is the child view 910a, the geometry of the 3D model 906 that is visualized (displayed) is updated based on the new orientation selected for the parent view 904a, as is shown in FIG. 9B, disclosed below.

In the example embodiment of FIG. 9B, the parent view 904b is created by a processor and visualizes the front view 915, as disclosed above with regard to FIG. 9A. Referring to FIGS. 9A and 9B, the parent view 904b and child view 910b represent the parent view 904a and child view 910a created by the processor in their respective initial/original states. The child view 910b is created by the processor from the existing projection, that is, the top view 907 which is the top projection of the 3D model 906 for the driven view, that is, the child view 910b.

A user may edit the parent view 904b, such as by rotating the parent view 904b by an angle in the plane of the projection, that is a respective plane of the front view 915 in the example embodiment for non-limiting example. Such rotating may be visualized by the processor via the display screen 103 of FIG. 1A, disclosed above. In FIG. 9C, disclosed below, the front view 915 is visualized in the parent view 904c to be rotated by ninety degrees, relative to the parent view 904b, in the same plane as the respective projection (i.e., front). As such, the parent view 904c is considered to be an updated (modified) version of the parent view 904b.

As shown in FIG. 9C, the child view 910c-1 is updated for the top orientation as the driven view was configured to visualize the top projection, as disclosed above with regard to FIG. 9A. The "Dim3" annotation cannot, however, be visualized (e.g., with its respective dimension lines) in the new projection of the child view 910c-1 and is, therefore, automatically updated by the processor to be rotated by ninety degrees and visualized in the child view 910c-2 for the user.

In the example embodiment of FIG. 9D, the front view 915 is visualized in the parent view 904d to be rotated by forty-five degrees, relative to the parent view 904b, in the same plane as the respective projection (i.e., front). As such, the parent view 904d is considered to be an updated version of the parent view 904b.

As shown in FIG. 9C, the child view 910d-1 is updated for the top orientation as the driven view was configured to visualize the top projection, as disclosed with regard to FIG. 9A. The Dim3 annotation cannot, however, be visualized in the new projection of the child view 910d-1 and is, therefore, automatically updated by the processor to be rotated by forty-five degrees and visualized in the child view 910c-2 for the user.

As such, FIG. 9C and FIG. 9D illustrate rotating (non-limiting examples in 90° and) 45° the parent view 904b of FIG. 9B in the same orientation and that the child view 910b is updated, automatically, responsive to the new orientation. In the example embodiment of FIG. 9E, a change in the parent's orientation (view orientation) changes to display a changed reference (face) of the parent view 904b. Such reference has been changed by the processor to another projection as visualized in the modified parent view 904e. The change is performed by the processor responsive to user input, such as the user input 108 of FIGS. 1A and 1B, disclosed above. The child view 910e shows the child view 910b as updated by the processor to the new projection of the parent view, such as visualized in the updated child view 910e. The child view 910e visualizes the update to the child view 910b that has been made according to the projection that has been selected for the parent view. As such, the child view 910e visualizes the new top view for the 3D model 906.

With reference to FIG. 9B, the child view 910b is offset by a rotational offset and angular offset relative to the parent view 904b and modifying the parent view 904b includes applying a change to a parent view orientation of the parent view. Further, modifying the child view 910b includes offsetting a child view orientation of the child view 910b, spatially, in order to cause the child view to remain at the rotational and angular offsets relative to the parent view following the change to the parent view orientation, as shown in FIGS. 9C-E.

FIGS. 10A-G are block diagrams portraying a non-limiting workflow example of creating a child view according to an example embodiment disclosed herein. With reference to FIGS. 1A-B and FIGS. 10A-G, such workflow example is performed in the CAD system 102 and begins with the user 112 providing user input 108 via the model view dialog 1088 of FIG. 10A that may be displayed by the processor on the display screen 103. The processor creates a first (initial) view of the 3D model 1006 based on such user input.

For example, in the example embodiment of FIG. 10B, the user 112 selects a reference (face) of the 3D model 1006, that is, the front view 1015 in the example embodiment, as indicated in the view selection field 1089 of the model view dialog 1088. In the example embodiment of FIG. 10C, the front view 1015 is visualized in the view that has been created by the processor (responsive to the user input 108) and such created view is employed as the parent view 1004 in the workflow example that continues with FIG. 10D as disclosed below.

Figure 10F:
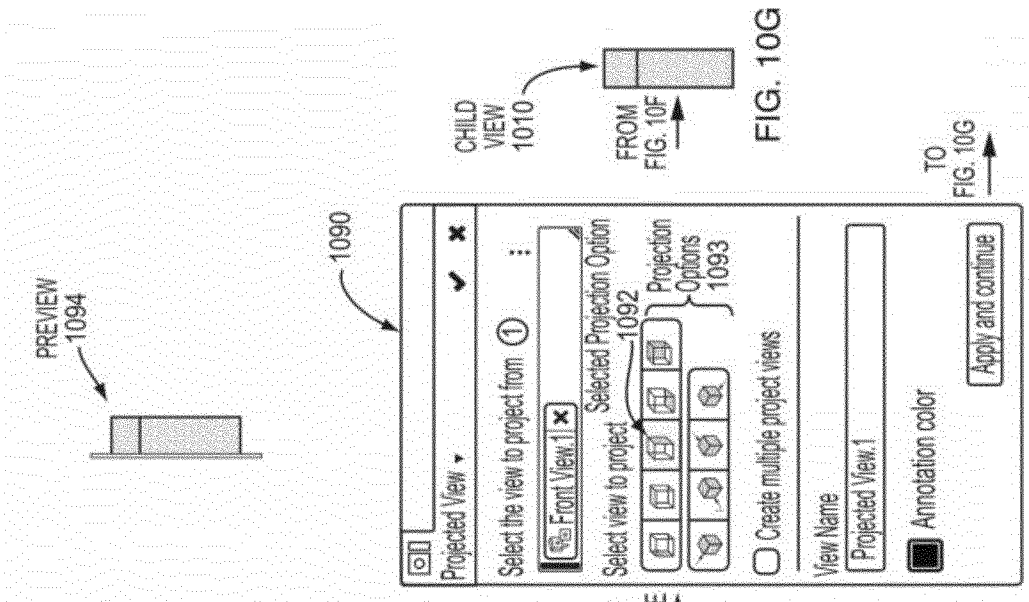
Figure 10E:
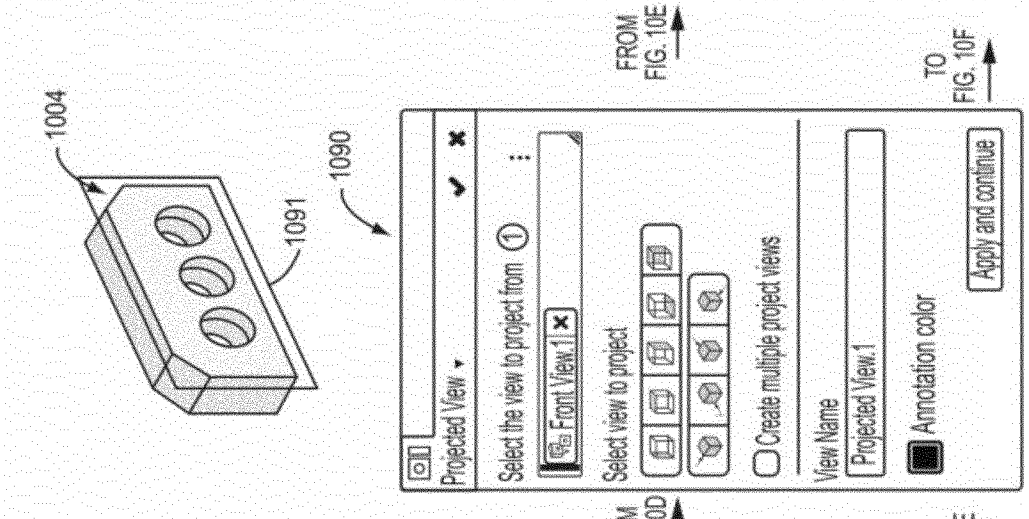
Figure 10D:
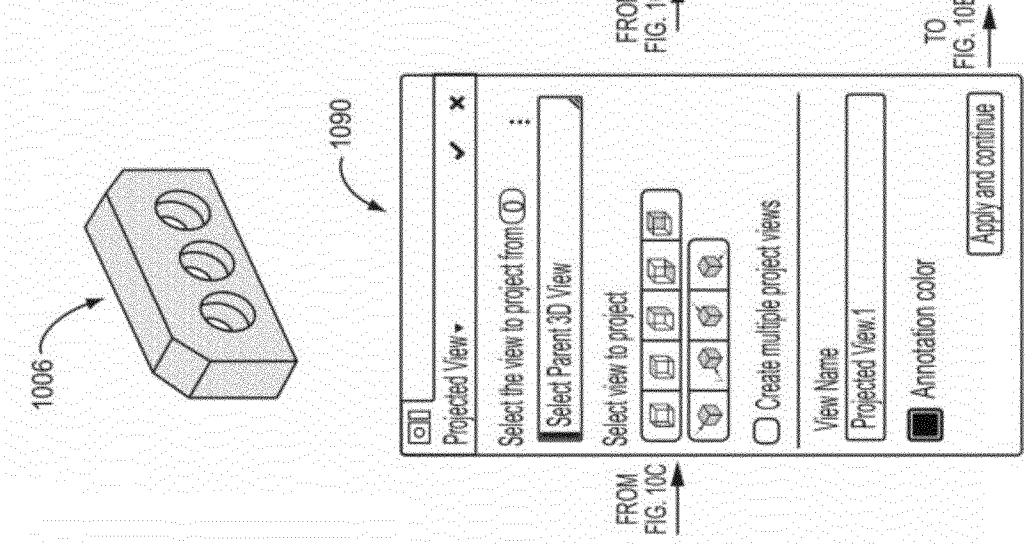
Figure 13:
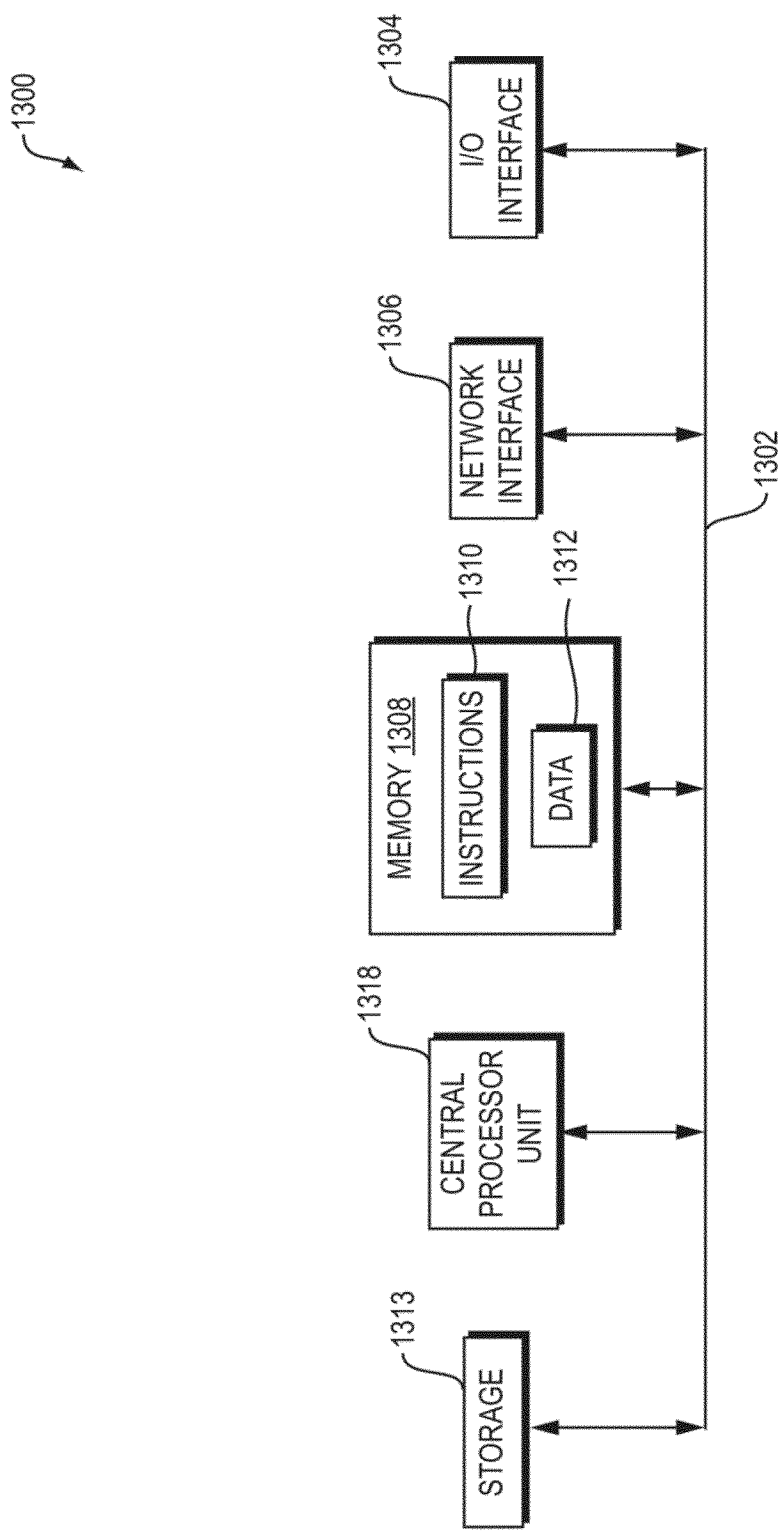

In the example embodiment of FIG. 10D, a projected view dialog 1090 is visualized by the processor, enabling the user 112 to enter user input 108 to cause the processor to begin creation of a projected view of the 3D model 1006 for use as a child view. Such creation is further enabled via selection 1091 of the previously created parent view 1004 to establish the relationship with the parent view 1004 as show in FIG. 10E. The parent view 1004 could be selected from a tree representing the 3D model 1006, and views thereof, or from a visual mechanism on the display screen 103, such as the projected view dialog 1090.

In the example embodiment of FIG. 10F, a projection option has been selected by the user 112 from among a plurality of projection options 1093 (e.g., orthogonal view options, such as right, left, top, bottom and rear), visualized by icons (generally, indicia) in the projection view dialog 1090 and the processor displays a preview 1094 of the selected projection option 1092 of the parent view 1004. The processor creates the child view 1010 shown in FIG. 10G based on the selected projection option 1092. According to an example embodiment, if the user 112 enters user input 108 causing the processor to make a change to the parent view 1004, the child view 1010 will keep the relationship created with such parent view. According to an example embodiment, the user 112 is also enabled to change the projection of the child view 1010, as disclosed below with regard to FIGS. 11A-G.

FIGS. 11A-G are block diagrams portraying a non-limiting workflow example of editing a parent view and child view thereof according to an example embodiment disclosed herein. Such workflow is described with reference to FIGS. 1A, 1B, and 11A-G. In the example embodiment of FIG. 11A, a parent view 1104 is selected via a model view dialog 1188 by the user 112 for editing. The model view dialog 1188 is visualized by the processor, for example, on the display screen 103. In the example embodiment of FIG. 11B, the user 112 uses the model view dialog 1188 to edit the parent view 1104 to change its previous reference (face) of the 3D model 1106 from the front view 1115 to the top view 1107. The parent view 1104, as edited, is visualized by the processor as the parent view 1104' modified.

In the example embodiment of FIG. 11E, the user 112 interacts with the projection view dialog 1190 to cause the processor to edit the child view 1110 by changing a selected projection option 1192 to the new projection option 1192', shown as being selected in the projection view dialog 1190 of FIG. 11F. In the example embodiment of FIG. 11F, a preview 1194 of the new projection option 1192' for the child view 1110 is shown. In the example embodiment of FIG. 11G, the child view 1110 is shown as the child view 1110' modified based on the new projection option 1192' selected.

FIG. 12 is a block diagram of an example embodiment of the parent and child views modified as disclosed above with regard to FIGS. 10A-G and 11A-G. The parent and child views of FIG. 12 are shown based on a user having switched to a drawings side (e.g., available in xDocument). In the example embodiment of FIG. 12, the parent view 1004 and child view 1010 of FIG. 10C and FIG. 10G, respectively, as initially created by the workflow as disclosed above, are illustrated in FIG. 12A as the parent view 1204*a* and child view 1210*a*, respectively.

The parent view 1204*b* and child view 1210*b* visualize the parent view 1104' and child view 1110 of FIG. 11D and FIG. 11E, respectively, after the user 112 caused the change to the reference (face) of the parent view 1204*a*, that is, the parent view 1004 of FIG. 11A. The parent view 1204*c* and child view 1210*c* illustrate the parent view 1204*b* and child view 1210*b*, respectively, as visualized for the user 112 by the processor following edits made to change the child view 1210*b* projection such that it represents the (new) bottom of the 3D model 1106 as shown in FIG. 11G.

Figure 13:
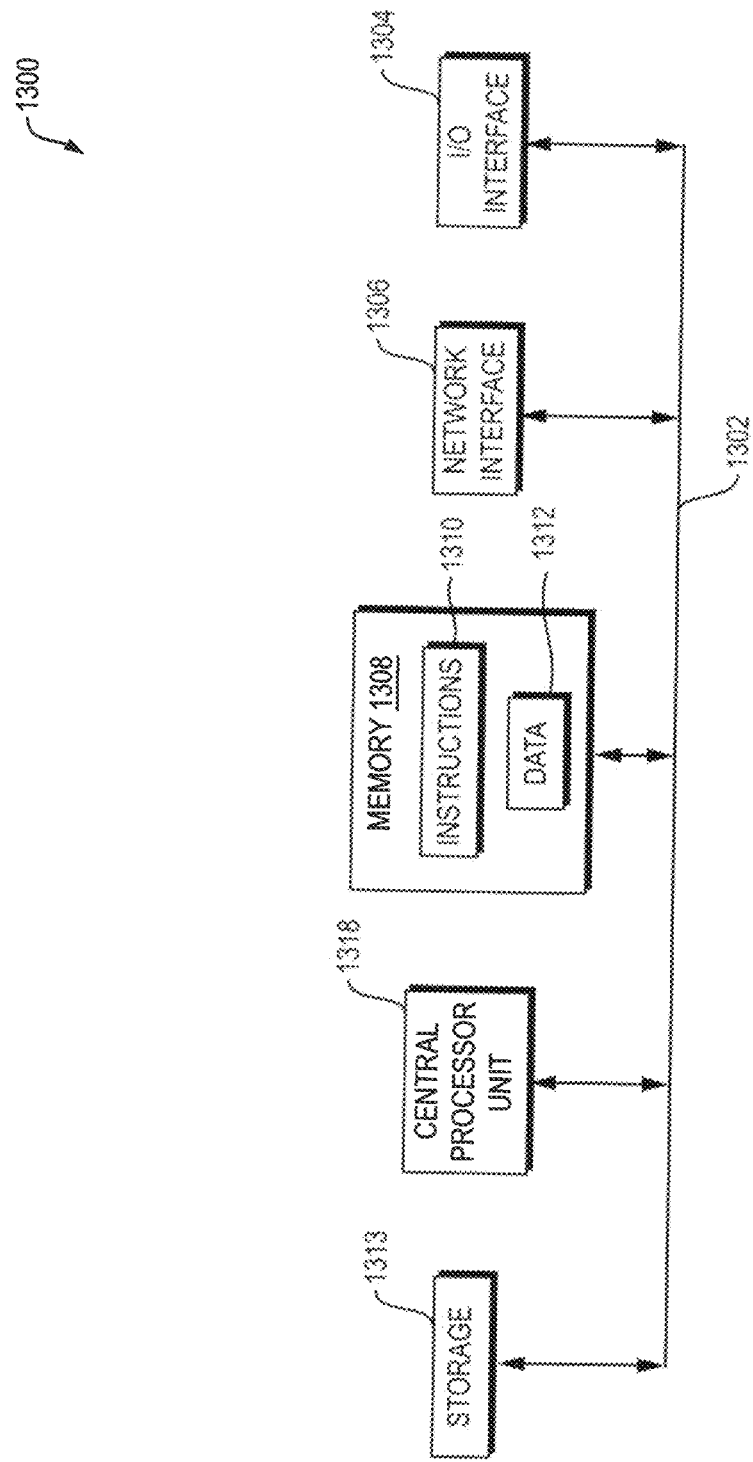
FIG. 13 is a block diagram of an example internal structure of a computer optionally within an embodiment disclosed herein.
Figure 1A:
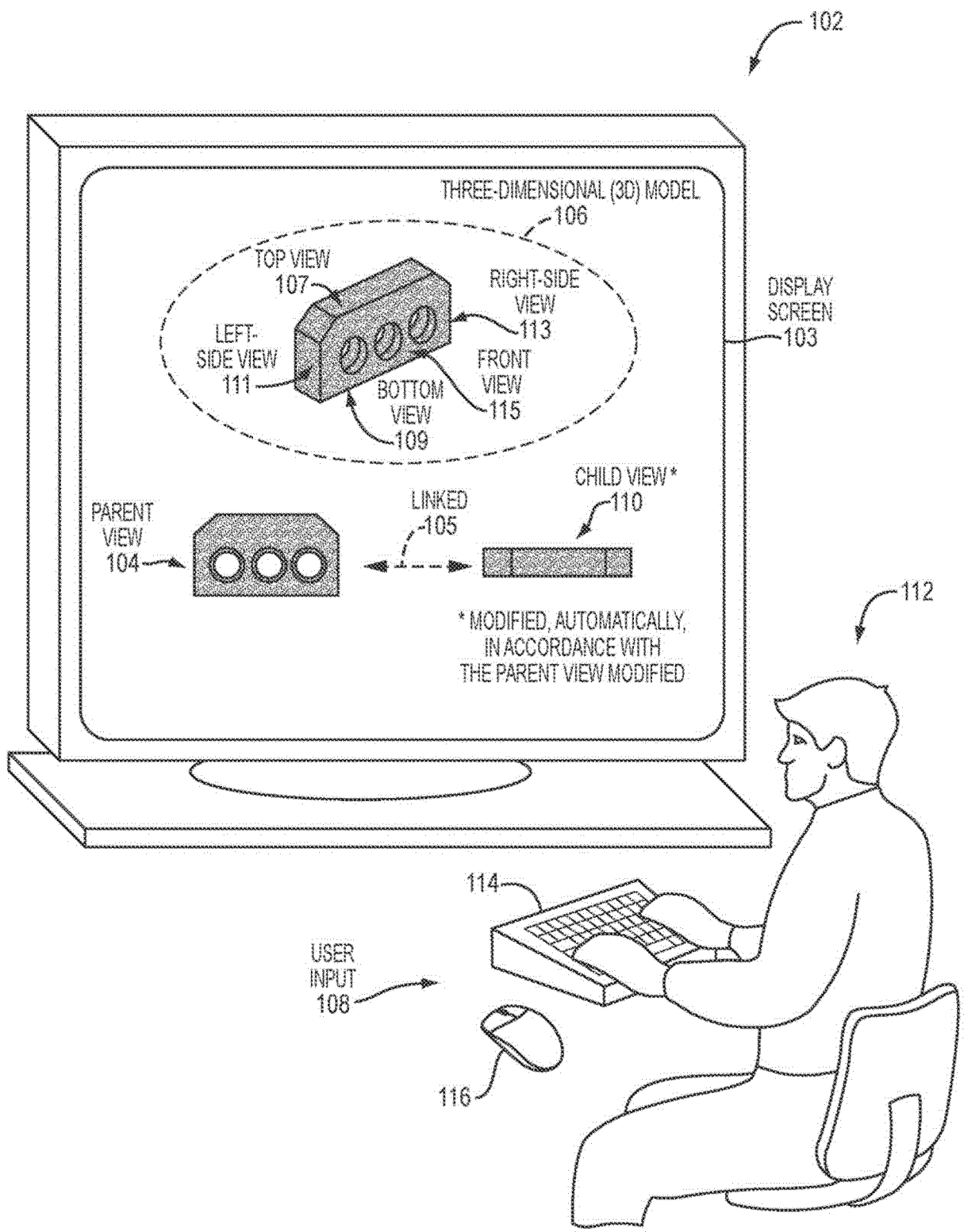
Figure 1B:
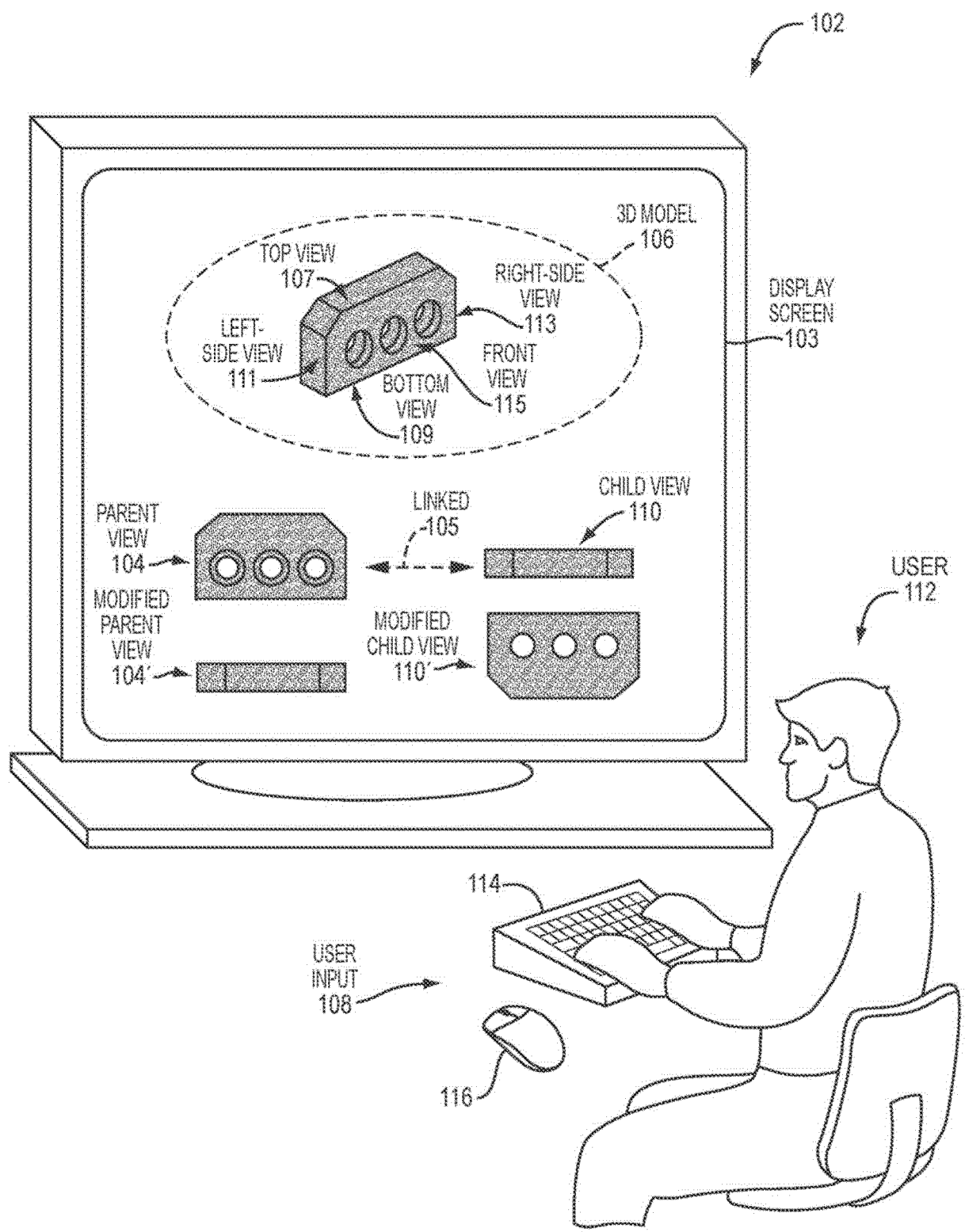
Figure 2:
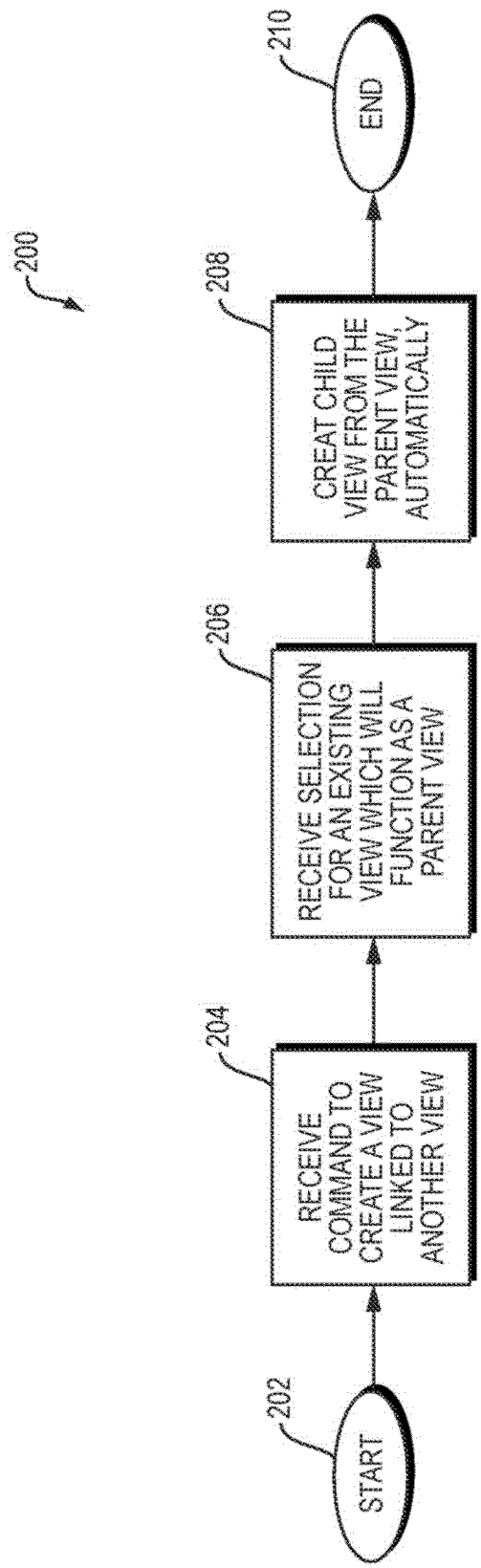
Figure 4:
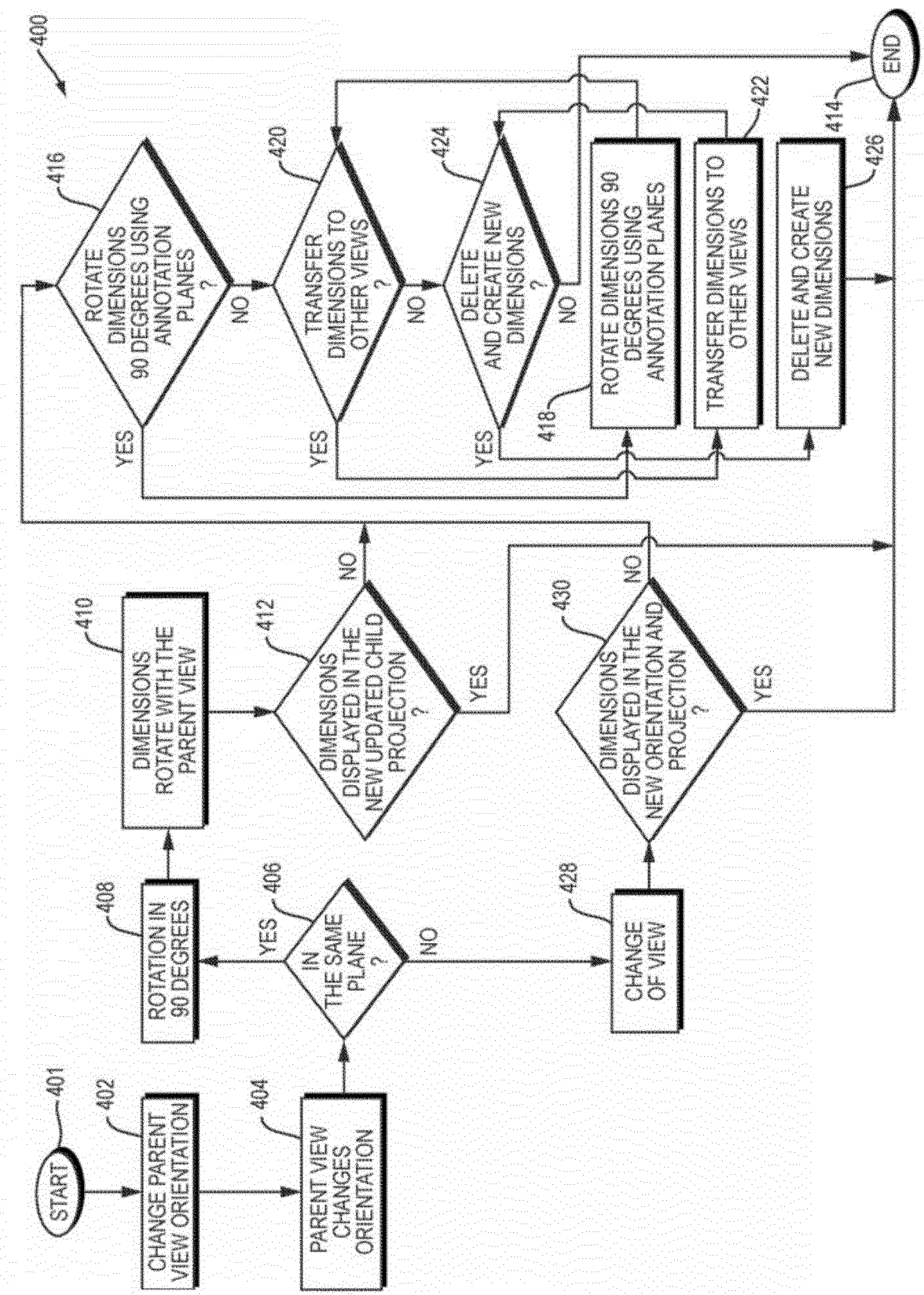
Figure 5:
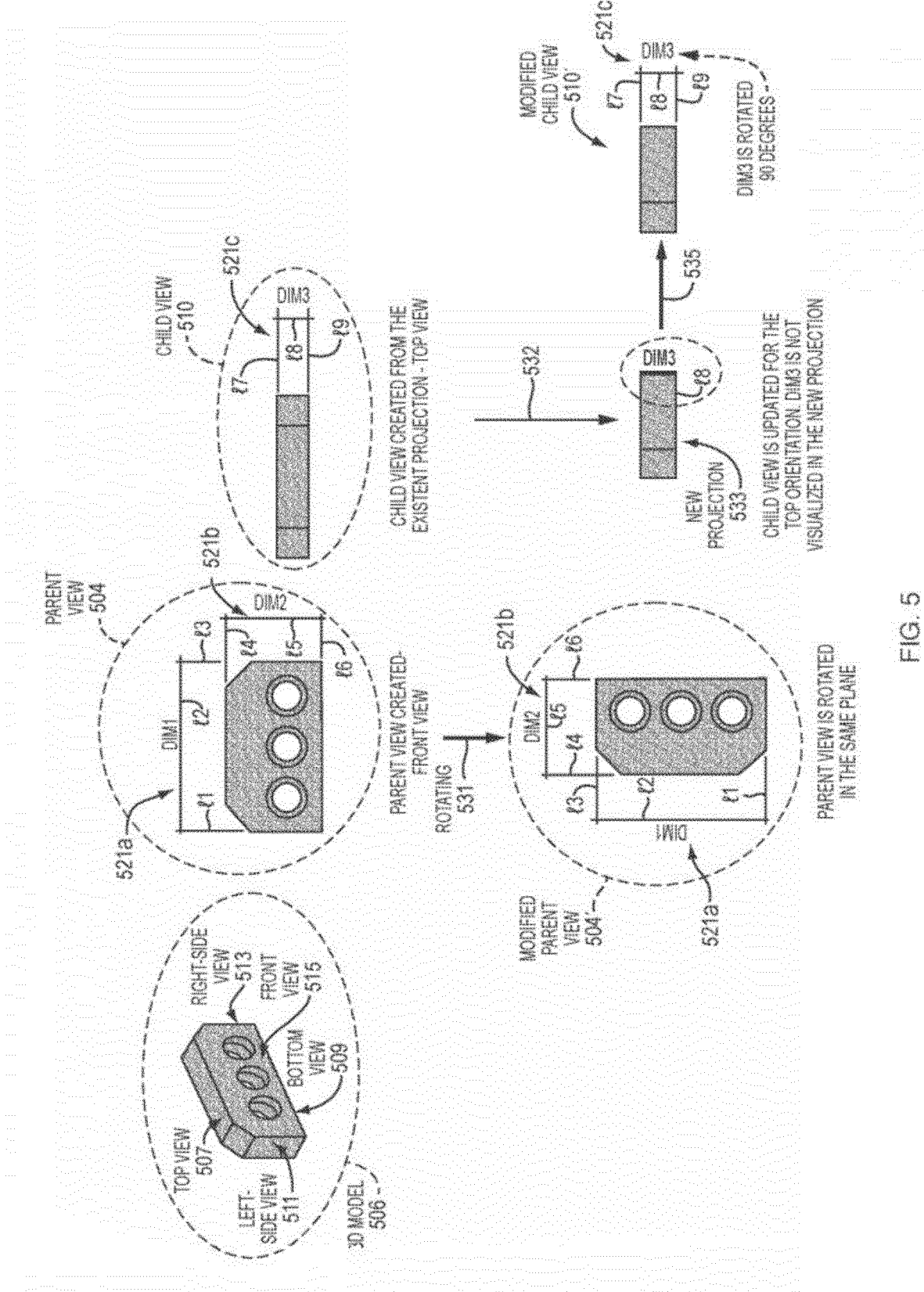
Figure 6A:
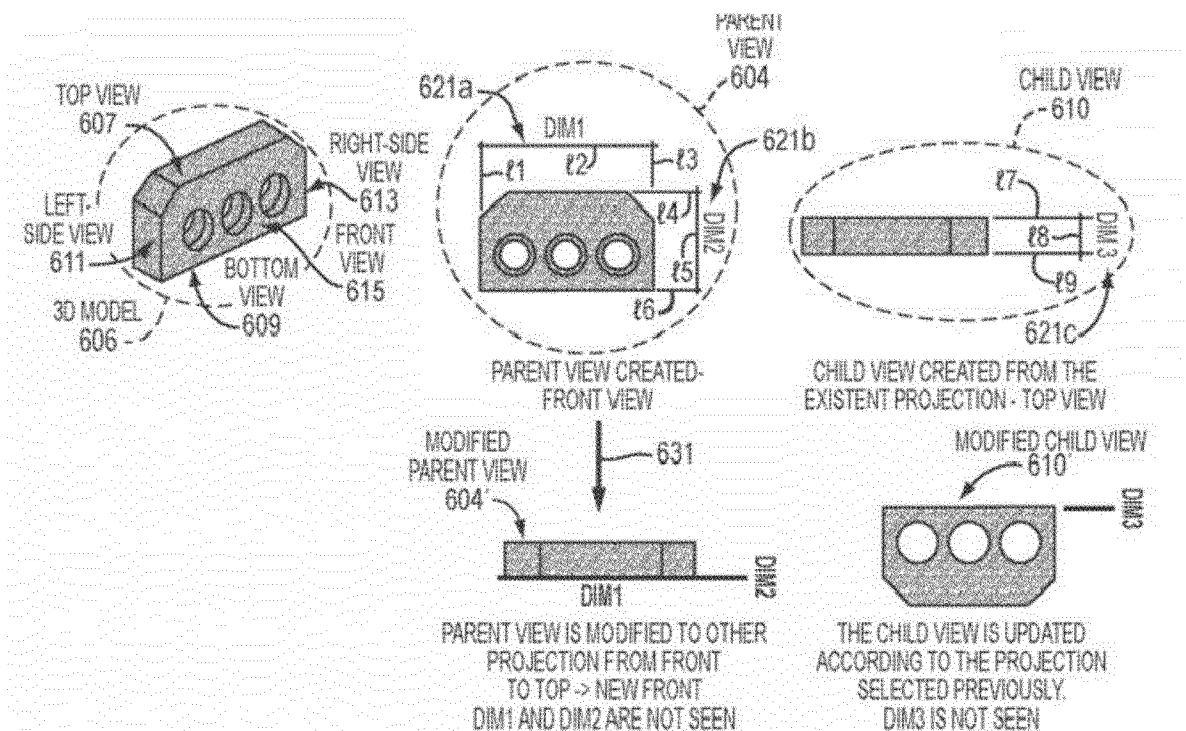
Figure 6B:
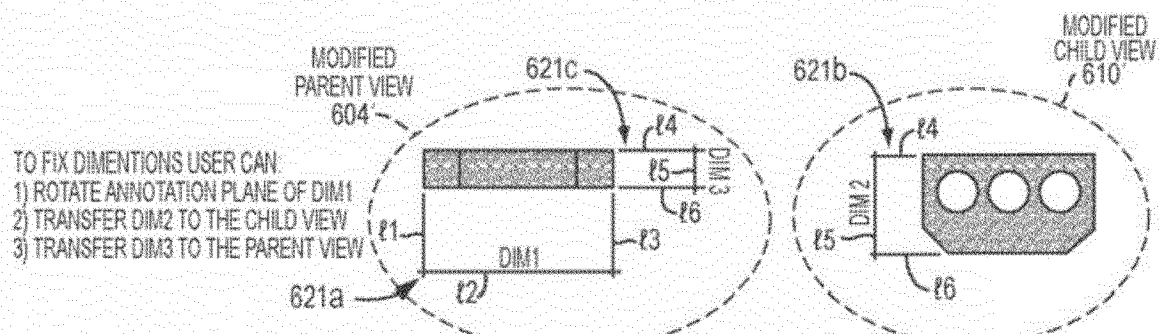
Figure 6C:
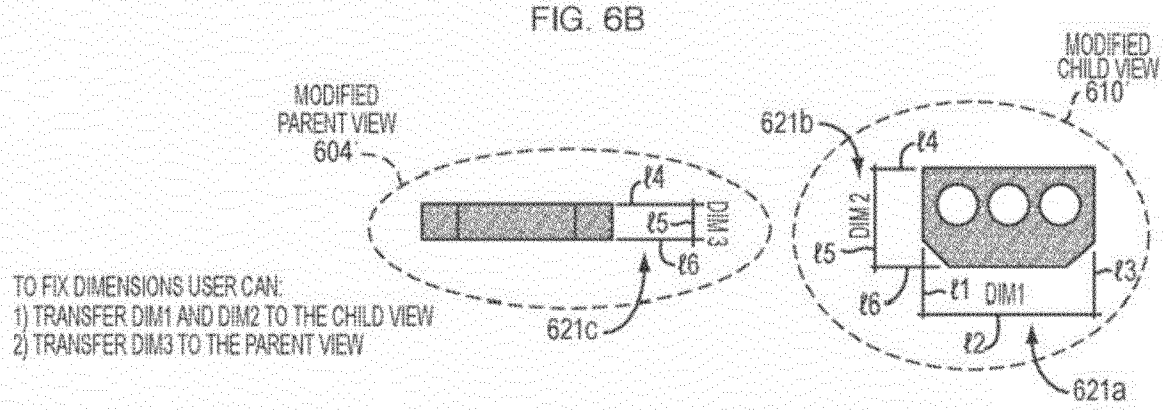
Figure 7:
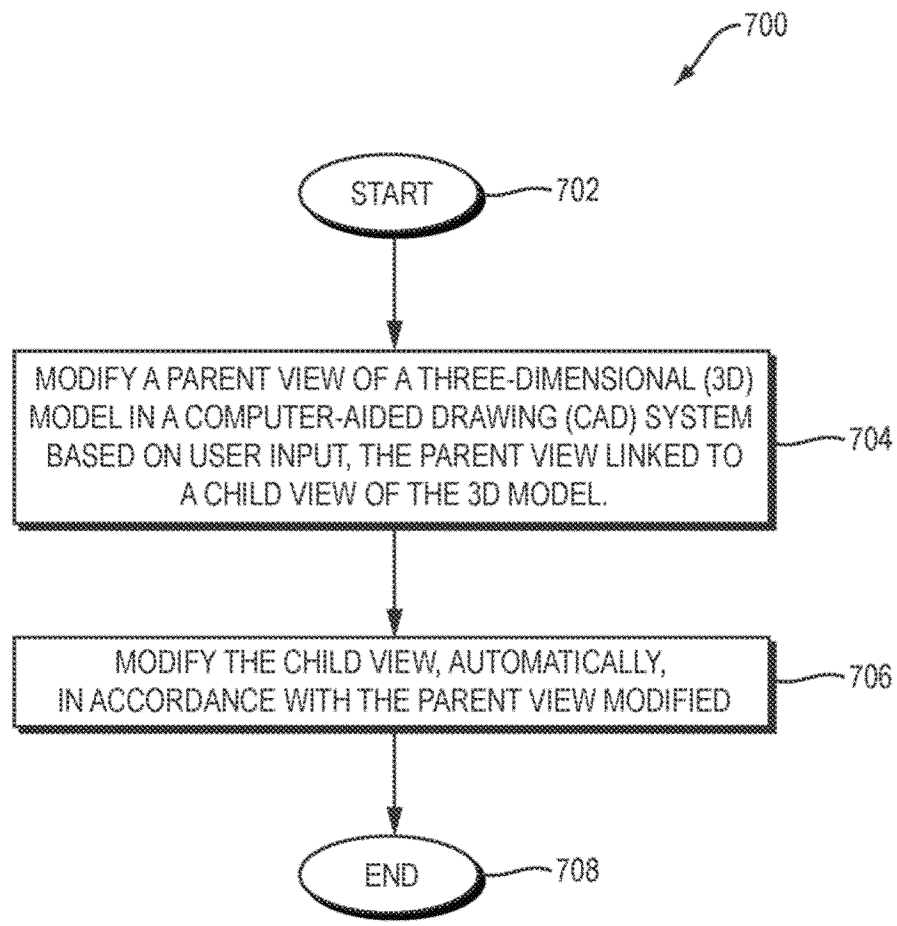

FIG. 13 is a block diagram of an example of the internal structure of a computer 1300 in which various embodiments of the present disclosure may be implemented. The computer 1300 contains a system bus 1302, where a bus is a set of hardware lines used for data transfer among the components of a computer or digital processing system. The system bus 1302 is essentially a shared conduit that connects different elements of a computer system (e.g., processor, disk storage, memory, input/output ports, network ports, etc.) that enables the transfer of information between the elements. Coupled to the system bus 1302 is an I/O device interface 1304 for connecting various input and output devices (e.g., keyboard, mouse, display monitors, printers, speakers, microphone, etc.) to the computer 1300. A network interface 1306 allows the computer 1300 to connect to various other devices attached to a network (e.g., global computer network, wide area network, local area network, etc.). Memory 1308 provides volatile or non-volatile storage for computer software instructions 1310 and data 1312 that may be used to implement embodiments (e.g., methods 200, 300, 400, 700, 800) of the present disclosure, where the volatile and non-volatile memories are examples of non-transitory media. Disk storage 1314 provides non-volatile storage for computer software instructions 1310 and data 1312 that may be used to implement embodiments (e.g., methods 200, 300, 400, 700, 800) of the present disclosure. A central processor unit 1318 is also coupled to the system bus 1302 and provides for the execution of computer instructions.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods and techniques described herein. It should be understood that elements of the block and flow diagrams may be implemented in software or hardware, such as via one or more arrangements of circuitry of FIG. 13, disclosed above, or equivalents thereof, firmware, a combination thereof, or other similar implementation determined in the future.

In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein.

While example embodiments have been particularly shown and described, it will be understood by those skilled in the art that various changes in form and details may be made therein without departing from the scope of the embodiments encompassed by the appended claims.

What is claimed is:

1. A computer-implemented method comprising:
    modifying a parent view of a three-dimensional (3D) model in a computer-aided drawing (CAD) system based on user input, the parent view linked to a child view of the 3D model, the child view created from the parent view, the user input provided to the CAD system, the parent view including a first saved view of the 3D model and a first presentation state of the 3D model, the child view including a second saved view of the 3D model and a second presentation state of the 3D model, the child view offset by a rotational offset and angular offset relative to the parent view; and modifying the child view, automatically, in accordance with the parent view modified, wherein modifying the parent view includes applying a change to a parent view orientation of the parent view and modifying the first saved view, first presentation state, or combination thereof, and wherein modifying the child view includes modifying the second saved view and second presentation state responsive to and in accordance with the first saved view modified and first presentation state modified, respectively.

2. The computer-implemented method of claim 1, wherein the parent view is a 3D view, wherein the 3D view includes the first saved view of the 3D model and the first presentation state of the 3D model, wherein the first saved view includes a retrievable view orientation of the 3D model, wherein the first presentation state is a retrievable state of the 3D model, and wherein:
modifying the first saved view, first presentation state, or combination thereof, includes altering a display of the 3D model by changing a model geometry, face color, material, view zoom level, the retrievable view orientation, other feature of the 3D model, or combination thereof; and
the display of the 3D model is a visualization of the 3D model shown on-screen in response to activation of the parent view.

3. The computer-implemented method of claim 2, wherein changing the model geometry includes suppressing at least a portion of the 3D model presented within the display, unsuppressing the at least a portion, showing or hiding the at least a portion, or changing configuration of the model geometry.

4. The computer-implemented method of claim 1, further comprising creating the parent view, creating the child view, and linking the child view created to the parent view created, wherein the parent view created has a primary view orientation, wherein the child view created is oriented at an orthogonal or other axonometric direction that has a locked relationship with the primary view orientation of the parent view created, and wherein creating the child view includes creating the child view from a projection of the 3D model.

5. The computer-implemented method of claim 1, wherein modifying the child view includes offsetting a child view orientation of the child view, spatially, in order to cause the child view to remain at the rotational and angular offsets relative to the parent view following the change to the parent view orientation.

6. The computer-implemented method of claim 1, wherein the parent view and child view are 3D views or two-dimensional (2D) views, wherein the parent view includes an annotation with an annotation orientation, the annotation orientation enabling the annotation to be attached to a model geometry of the 3D model and aligned to a parent view orientation of the parent view of the 3D model, the annotation orientation further enabling the annotation to be aligned with a readable direction of the parent view orientation, wherein modifying the parent view includes changing the parent view orientation to a new parent view orientation, and wherein the computer-implemented method further comprises:
detecting that the parent view orientation of the parent view has been modified;
determining whether the new parent view orientation enables (i) the annotation to remain attached to the model geometry and (ii) the annotation to be aligned with the new parent view orientation in a manner that enables the annotation to be aligned with the readable direction to enable readability of the annotation; and
in an event the determining concludes that the new parent view orientation does not enable (i) and (ii), then:
identifying the annotation, visibly, via a change in color, graphical icon, or other visual modification to the annotation,
deleting the annotation,
ignoring the annotation, or
moving the annotation, automatically, to the child view or to a given view in an event the child view or given view enables (i) and (ii).

7. The computer-implemented method of claim 6, wherein, in an event the determining concludes that the new parent view orientation does enable (i) and (ii), the computer-implemented method further comprises changing the annotation orientation to a new annotation orientation that is offset, spatially, relative to a new view direction of the new parent view orientation, to enable (ii) while maintaining (i).

8. The computer-implemented method of claim 7, further comprising querying a zoom level for the parent view, and wherein, in an event the new annotation orientation causes the annotation to be positioned in a manner that does not enable display of the annotation in the parent view, the computer-implemented method further comprises repositioning the annotation so that it is offset from the 3D model in a readable manner outside the model geometry and within the zoom level queried, the repositioning enabling the annotation to be displayed in the parent view responsive to activation of the parent view.

9. The computer-implemented method of claim 1, wherein the first and second saved views include respective retrievable orientations of the 3D model and wherein the first and second presentation states include respective retrievable states of the 3D model.

10. A computer-aided design (CAD) system comprising:
a memory; and
a processor configured to modify a parent view of a three-dimensional (3D) model based on user input provided to the CAD system, the parent view linked to a child view of the 3D model, the child view created from the parent view, the 3D model stored in the memory, the child view offset by a rotational offset and angular offset relative to the parent view,
the processor further configured to modify the child view, automatically, in accordance with the parent view modified, wherein to modify the parent view, the processor is further configured to apply a change to a parent view orientation of the parent view and modify a first saved view of the 3D model, a first presentation state of the 3D model, or combination thereof, and wherein to modify the child view, the processor is further configured to modify a second saved view and a second presentation state responsive to and in accordance with the first saved view modified and first presentation state modified, respectively.

11. The CAD system of claim 10, wherein the parent view is a 3D view, wherein the 3D view includes the first saved view of the 3D model and the first presentation state of the 3D model, wherein the first saved view includes a retrievable view orientation of the 3D model, wherein the first presentation state is a retrievable state of the 3D model, and wherein:
to modify the first saved view, first presentation state, or combination thereof, the processor is further configured to alter a display of the 3D model by changing a model geometry, face color, material, view zoom level, the retrievable view orientation, other feature of the 3D model, or combination thereof; and the display of the 3D model is a visualization of the 3D model shown on-screen in response to activation of the parent view.

12. The CAD system of claim 11, wherein changing the model geometry includes suppressing at least a portion of the 3D model presented within the display, unsuppressing the at least a portion, showing or hiding the at least a portion, or changing configuration of the model geometry.

13. The CAD system of claim 10, wherein the processor is further configured to create the parent view, create the child view, and link the child view created to the parent view created, wherein the parent view created has a primary view orientation, wherein the child view created is oriented at an orthogonal or other axonometric direction that has a locked relationship with the primary view orientation of the parent view created, and wherein, to create the child view, the processor is further configured to create the child view from a projection of the 3D model.

14. The CAD system of claim 10, wherein, to modify the child view, the processor is further configured to offset a child view orientation of the child view, spatially, in order to cause the child view to remain at the rotational and angular offsets relative to the parent view following the change to the parent view orientation.

15. The CAD system of claim 10, wherein the parent view and child view are 3D views or two-dimensional (2D) views, wherein the parent view includes an annotation with an annotation orientation, the annotation orientation enabling the annotation to be attached to a model geometry of the 3D model and aligned to a parent view orientation of the parent view of the 3D model, the annotation orientation further enabling the annotation to be aligned with a readable direction of the parent view orientation, wherein, to modify the parent view, the processor is further configured to change the parent view orientation to a new parent view orientation, and wherein the processor is further configured to:

detect that the parent view orientation of the parent view has been modified; and determine whether the new parent view orientation enables (i) the annotation to remain attached to the model geometry and (ii) the annotation to be aligned with the new parent view orientation in a manner that enables the annotation to be aligned with the readable direction to enable readability of the annotation, wherein, in an event the processor determines that the new parent view orientation does not enable (i) and (ii), the processor is further configured to: (a) identify the annotation, visibly, via a change in color, graphical icon, or other visual modification to the annotation, (b) delete the annotation, (c) ignore the annotation, or (d) move the annotation, automatically, to the child view or to a given view in an event the child view or given view enables (i) and (ii), and wherein, in an event the determining concludes that the new parent view orientation does enable (i) and (ii), the processor is further configured to change the annotation orientation to a new annotation orientation that is offset, spatially, relative to a new view direction of the new parent view orientation, to enable (ii) while maintaining (i).

16. The CAD system of claim 15, wherein the processor is further configured to query a zoom level for the parent view, and wherein, in an event the new annotation orientation causes the annotation to be positioned in a manner that does not enable display of the annotation in the parent view, the processor is further configured to reposition the annotation so that it is offset from the 3D model in a readable manner outside the model geometry and within the zoom level queried, the annotation repositioned in a manner enabling the annotation to be displayed in the parent view responsive to activation of the parent view.

17. The CAD system of claim 10, wherein the first and second saved views include respective retrievable orientations of the 3D model and wherein the first and second presentation states include respective retrievable states of the 3D model.

18. A non-transitory computer-readable medium having encoded thereon a sequence of instructions which, when loaded and executed by a processor, causes the processor to:

modify a parent view of a three-dimensional (3D) model in a computer-aided drawing (CAD) system based on user input, the parent view linked to a child view of the 3D model, the child view created from the parent view, the user input provided to the CAD system, the parent view including a first saved view of the 3D model and a first presentation state of the 3D model, the child view including a second saved view of the 3D model and a second presentation state of the 3D model, the child view offset by a rotational offset and angular offset relative to the parent view; and modify the child view, automatically, in accordance with the parent view modified, wherein modifying the parent view includes applying a change to a parent view orientation of the parent view and modifying the first saved view, first presentation state, or combination thereof, and wherein modifying the child view includes modifying the second saved view and second presentation state responsive to and in accordance with the first saved view modified and first presentation state modified, respectively.

* * * * *

UNITED STATES PATENT AND TRADEMARK OFFICE
CERTIFICATE OF CORRECTION

| | | |
|---|---|---|
| PATENT NO. | : 12,307,164 B2 | Page 1 of 18 |
| APPLICATION NO. | : 17/246483 | |
| DATED | : May 20, 2025 | |
| INVENTOR(S) | : Felipe Martinez Quiroz and Matthew Lorono | |

It is certified that error appears in the above-identified patent and that said Letters Patent is hereby corrected as shown below:

On the Title Page

The Title page, showing the illustrative figure, should be deleted and substitute therefor the attached Title page.

In the Drawings

Delete Sheets 1-15, Figures 1A-13, at pages 3-17, and substitute therefor the Replacement Drawing Sheets, consisting of a total of 16 sheets, Figures 1A-13.

Signed and Sealed this
Fifteenth Day of July, 2025

Coke Morgan Stewart
*Acting Director of the United States Patent and Trademark Office*

(12) United States Patent
Martinez Quiroz et al.

(10) Patent No.: US 12,307,164 B2
(45) Date of Patent: May 20, 2025

(54) LINKING VIEWS/STATES OF 3D MODELS AND PROPAGATING UPDATES IN SAME

(71) Applicant: Dassault Systemes SolidWorks Corporation, Waltham, MA (US)

(72) Inventors: Felipe Martinez Quiroz, Cambridge (GB); Matthew Lorono, Broomfield, CO (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 981 days.

(21) Appl. No.: 17/246,483

(22) Filed: Apr. 30, 2021

(65) Prior Publication Data
US 2022/0350937 A1 Nov. 3, 2022

(51) Int. Cl.
*G06F 30/10* (2020.01)
*G06F 3/04815* (2022.01)
*G06T 19/20* (2011.01)

(52) U.S. Cl.
CPC ............ *G06F 30/10* (2020.01); *G06T 19/20* (2013.01); *G06F 3/04815* (2013.01); *G06T 2200/24* (2013.01); *G06T 2219/004* (2013.01); *G06T 2219/2012* (2013.01)

(58) Field of Classification Search
None
See application file for complete search history.

(56) References Cited

U.S. PATENT DOCUMENTS

| | | | |
|---|---|---|---|
| 6,944,513 B1 | 9/2005 | Tomomitsu et al. | |
| 9,177,110 B1* | 11/2015 | Fram | G06T 11/60 |
| 9,454,623 B1* | 9/2016 | Kaptsan | G06F 30/13 |

(Continued)

FOREIGN PATENT DOCUMENTS

| | | |
|---|---|---|
| EP | 3 097 543 A1 | 11/2016 |
| JP | 2001-067394 A | 3/2001 |

(Continued)

OTHER PUBLICATIONS

Ellenberg ("Using 3D Geometry in AutoCAD for multi-view drawings", https://www.youtube.com/watch?v=bAIG7-IzH5s, May 1, 2013) (Year: 2013).*

(Continued)

*Primary Examiner* — Jeffrey J Chow
(74) *Attorney, Agent, or Firm* — Hamilton, Brook, Smith & Reynolds, P.C.

(57) ABSTRACT

A computer-aided design (CAD) system and corresponding method manage three-dimensional (3D) model view/state modifications. The method modifies a parent view of a 3D model in the CAD system based on user input provided to the CAD system. The parent view is linked to a child view of the 3D model that was created from the parent view. The method modifies the child view, automatically, in accordance with the parent view modified. Such linked views and automatic modification enable a user to change view/state of a parent view and have the changes automatically propagated to the child view/state. Further, when such propagation occurs, orientations, positions, and readable directions of annotations are also updated, automatically, saving users (e.g., design engineers) minutes, hours and even days of work on design of the 3D model.

18 Claims, 16 Drawing Sheets

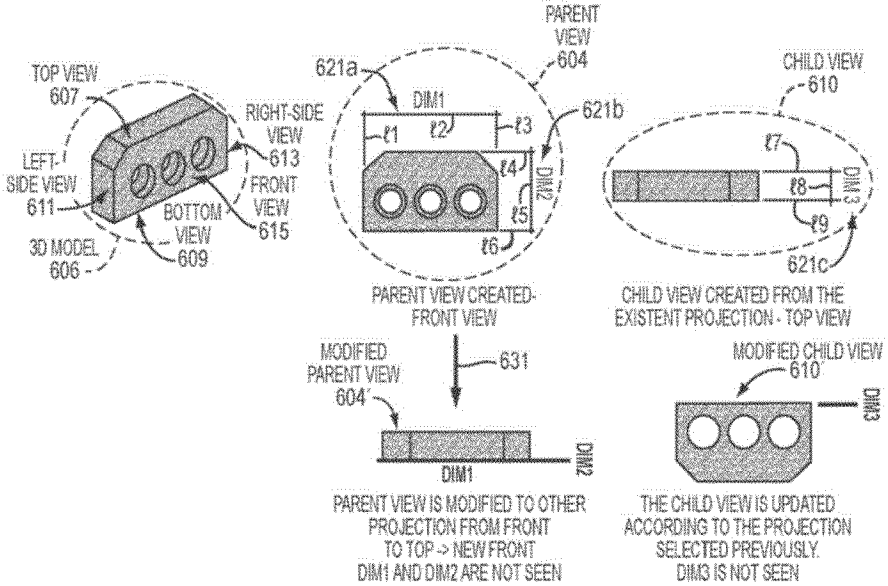

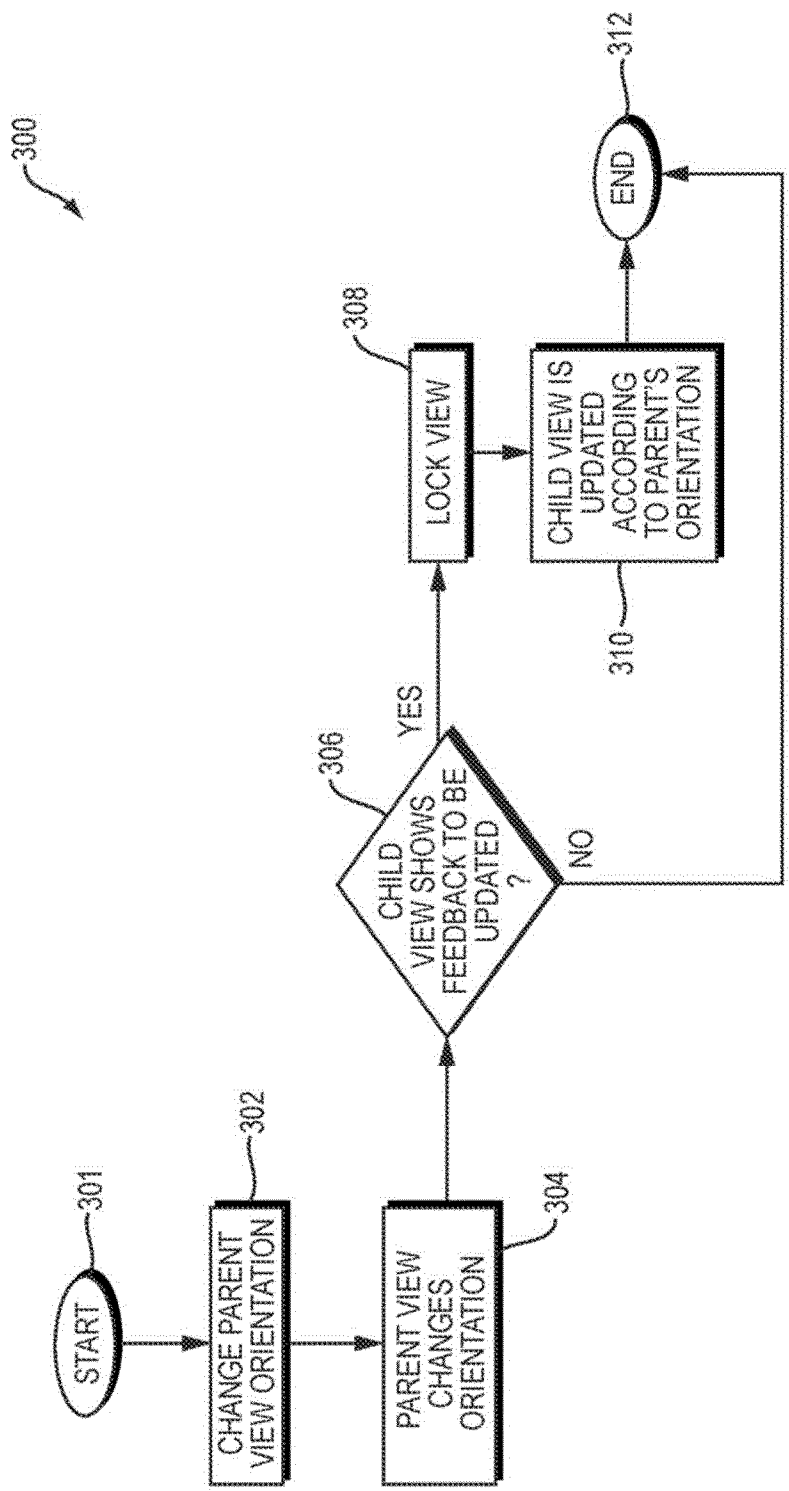

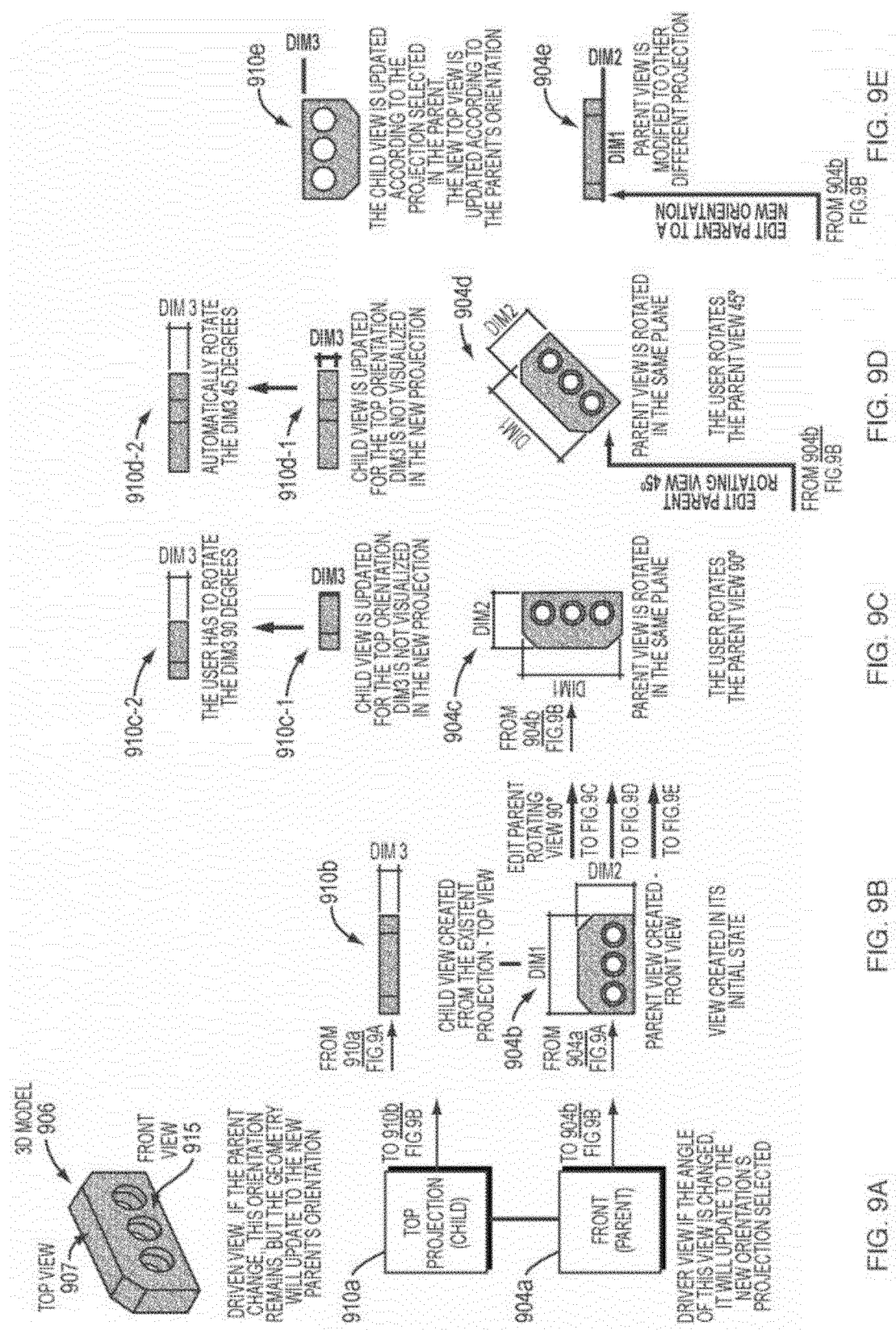

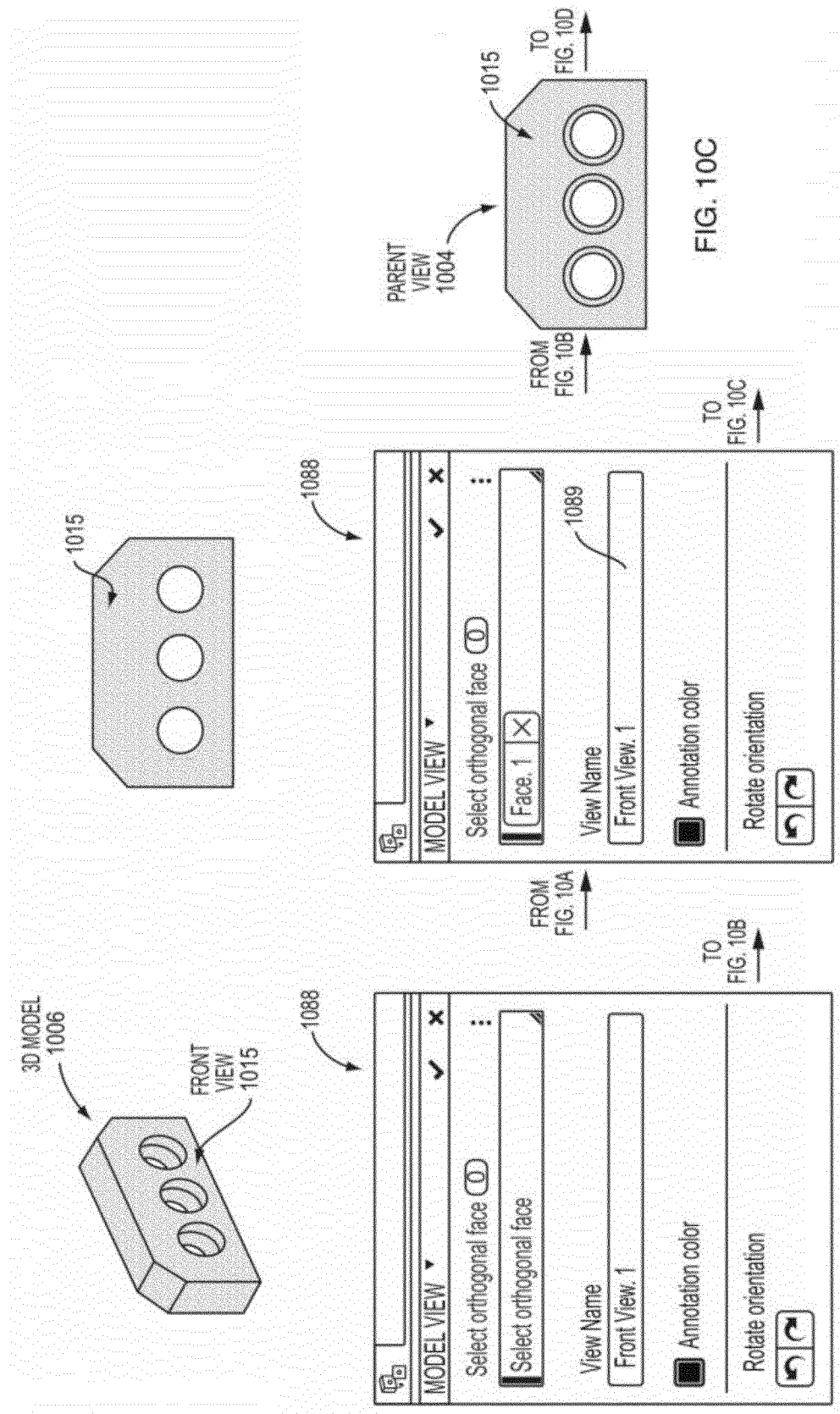

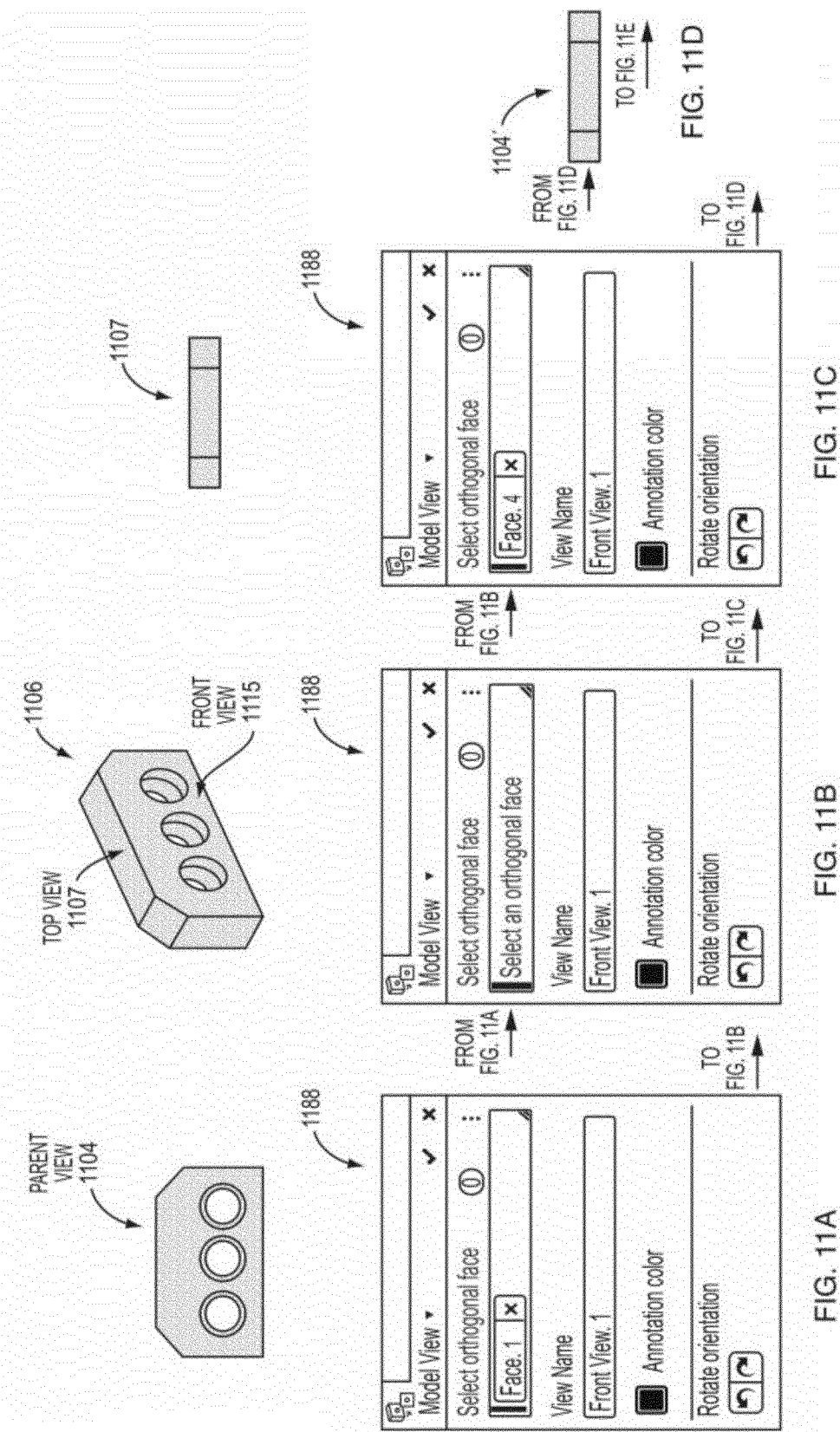

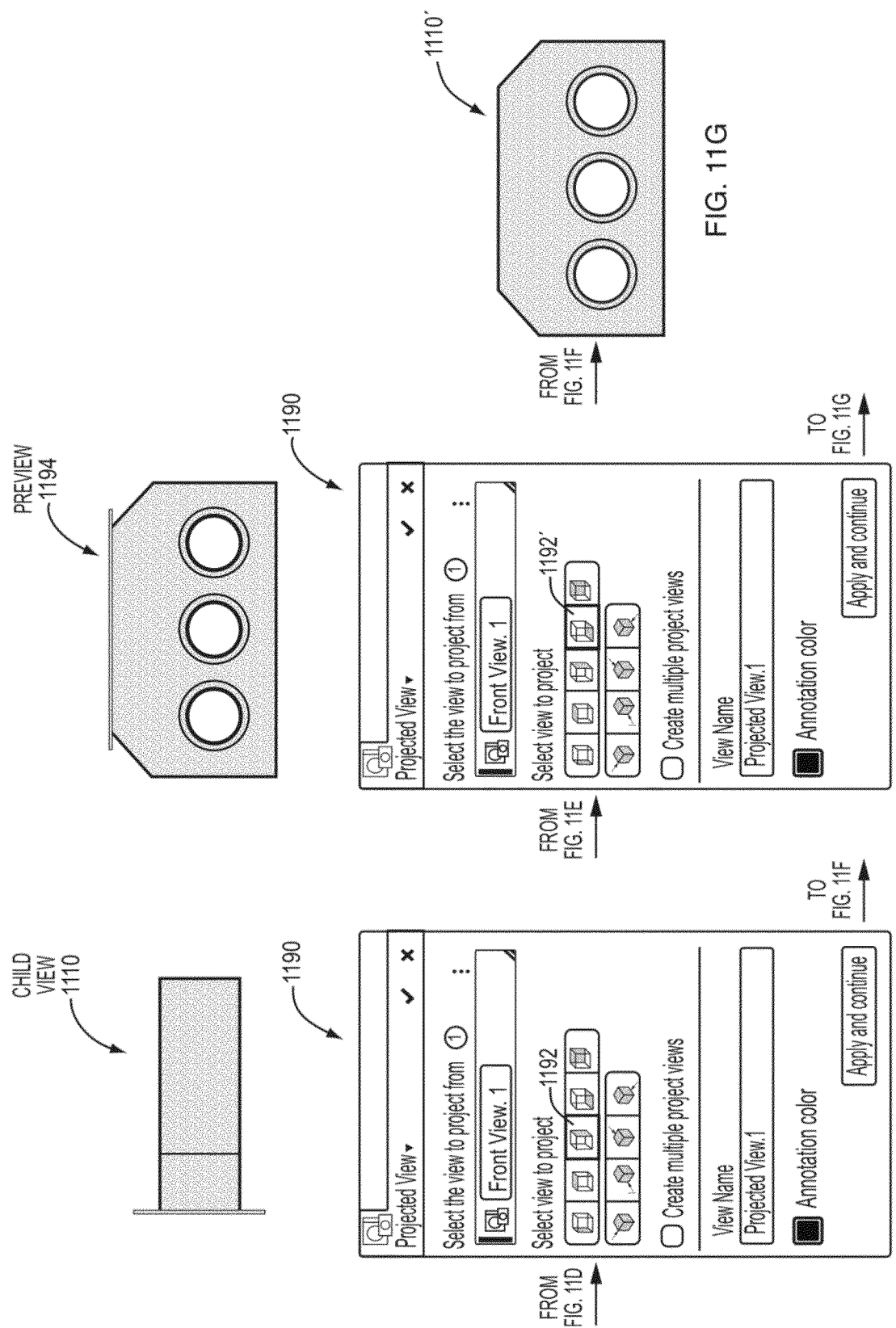

THIS IS HOW THE USER WOULD SEE THE VIEWS IN A 2D SHEET

THIS IS HOW THE USER WOULD SEE THE VIEWS THE FIRST TIME
(PARENT VIEW IN FRONT ORIENTATION AND CHILD AS A RIGHT ORIENTATION)

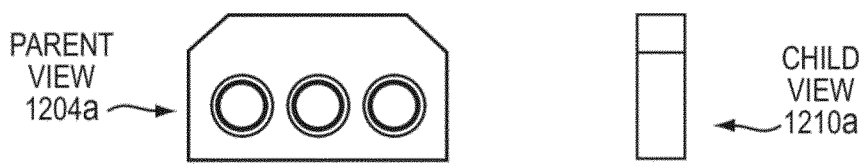

THIS IS HOW THE USER WOULD SEE THE VIEWS AFTER THE
USER CHANGED THE PARENT'S REFERENCE, SO THE CHILD
UPDATES TO THE NEW ORIENTATION

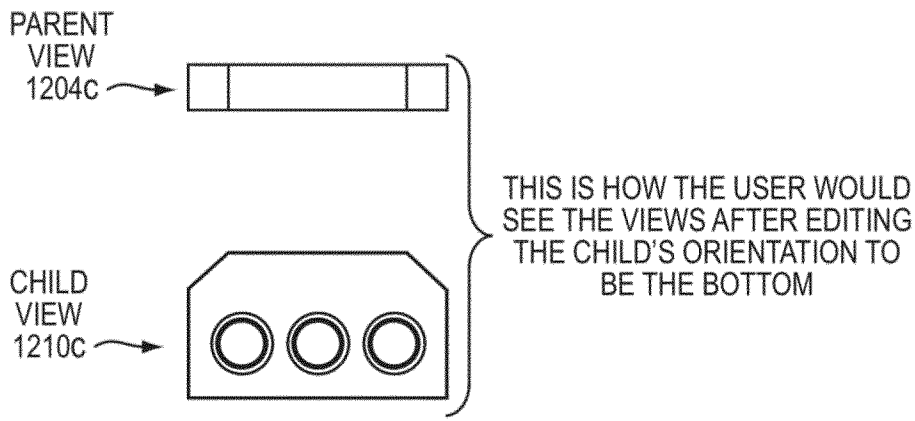

THIS IS HOW THE USER WOULD
SEE THE VIEWS AFTER EDITING
THE CHILD'S ORIENTATION TO
BE THE BOTTOM

FIG. 12